(12) United States Patent
Lu et al.

(10) Patent No.: US 12,469,808 B2
(45) Date of Patent: Nov. 11, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chih-Hsin Lu, Tainan (TW); Chung-Hao Tsai, Changhua County (TW); Chuei-Tang Wang, Taichung (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 570 days.

(21) Appl. No.: 17/892,102

(22) Filed: Aug. 21, 2022

(65) Prior Publication Data

US 2024/0063160 A1 Feb. 22, 2024

(51) Int. Cl.
*H01L 23/00* (2006.01)
*H01L 23/48* (2006.01)
(Continued)

(52) U.S. Cl.
CPC ............ *H01L 24/08* (2013.01); *H01L 23/481* (2013.01); *H01L 23/5226* (2013.01); *H01L 23/5283* (2013.01); *H01L 23/5286* (2013.01); *H01L 24/05* (2013.01); *H01L 24/13* (2013.01); *H01L 24/80* (2013.01); *H01L 25/0657* (2013.01);
(Continued)

(58) Field of Classification Search
CPC ......... H01L 24/08; H01L 24/05; H01L 24/13; H01L 24/80; H01L 25/0657; H01L 2224/08146; H01L 2224/13026; H01L 2224/08145; H01L 23/481; H01L 23/5226
See application file for complete search history.

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

| CN | 113257796 A | * | 8/2021 | ....... H01L 21/76895 |
| TW | 202109782 | | 3/2021 | |
| TW | 202230541 | | 8/2022 | |

OTHER PUBLICATIONS

"Office Action of Taiwan Counterpart Application", issued on Dec. 29, 2023, p. 1-p. 6.

*Primary Examiner* — Mamadou L Diallo
(74) *Attorney, Agent, or Firm* — JCIPRNET

(57) ABSTRACT

A semiconductor package structure and a manufacturing method thereof is provided. The semiconductor package includes a first semiconductor die, including a semiconductor substrate and a first interconnect structure disposed on the semiconductor substrate; a second semiconductor die disposed on and electrically connected to the first semiconductor die, including a second semiconductor substrate and a second interconnect structure; a third interconnect structure, where in the second interconnect structure and the third interconnect structure are disposed on opposite sides of the second semiconductor substrate, and wherein the second interconnect structure is between the first interconnect structure and the third interconnect structure.

20 Claims, 20 Drawing Sheets

(51) Int. Cl.
  *H01L 23/522* (2006.01)
  *H01L 23/528* (2006.01)
  *H01L 25/065* (2023.01)

(52) U.S. Cl.
  CPC ............ *H01L 2224/05016* (2013.01); *H01L 2224/05556* (2013.01); *H01L 2224/05576* (2013.01); *H01L 2224/0801* (2013.01); *H01L 2224/08146* (2013.01); *H01L 2224/13026* (2013.01); *H01L 2224/80895* (2013.01); *H01L 2224/80896* (2013.01); *H01L 2225/06524* (2013.01); *H01L 2225/06544* (2013.01); *H01L 2225/06568* (2013.01); *H01L 2924/1011* (2013.01); *H01L 2924/10157* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 11,387,177 B2* | 7/2022 | Chien | H01L 21/565 |
| 2011/0248396 A1* | 10/2011 | Liu | H01L 25/0657 |
| | | | 438/459 |
| 2019/0043792 A1* | 2/2019 | Weerasekera | H01L 25/0652 |
| 2019/0122931 A1* | 4/2019 | Huang | H01L 24/74 |
| 2020/0006324 A1* | 1/2020 | Chen | H01L 24/09 |
| 2020/0312817 A1* | 10/2020 | Wu | H01L 23/53209 |
| 2020/0411636 A1* | 12/2020 | Kao | H01L 23/5223 |
| 2021/0082873 A1* | 3/2021 | Chen | H01L 23/53257 |
| 2021/0134748 A1* | 5/2021 | Liu | H01L 25/50 |
| 2021/0134779 A1* | 5/2021 | Huang | H01L 24/27 |
| 2021/0366854 A1* | 11/2021 | Yu | H01L 23/481 |
| 2021/0391302 A1* | 12/2021 | Kao | H01L 21/76898 |
| 2022/0077109 A1* | 3/2022 | Chava | H01L 25/0657 |
| 2022/0328447 A1* | 10/2022 | Kao | H01L 23/5283 |
| 2022/0415814 A1* | 12/2022 | Waidhas | H01L 25/18 |
| 2023/0080278 A1* | 3/2023 | Tripathi | H01L 24/92 |
| | | | 257/773 |
| 2023/0111854 A1* | 4/2023 | Choi | H01L 23/49811 |
| | | | 257/668 |
| 2023/0163112 A1* | 5/2023 | We | H01L 23/49822 |
| | | | 257/774 |
| 2023/0230902 A1* | 7/2023 | Lu | H01L 25/0657 |
| | | | 257/690 |

\* cited by examiner

SEMICONDUCTOR PACKAGE AND MANUFACTURING METHOD THEREOF

BACKGROUND

Integrating multiple types of devices or components is a continuing objective in building integrated circuit and packages. Each component in the integrated circuit and package incorporate with other components well when the relative routing and thermal designs are optimized. Typically, electrically connection between components are provided by direct metallization structure formation or metal to metal jointing. In this way, the design of the electrical connection between components can become a key consideration of the optimization of the system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
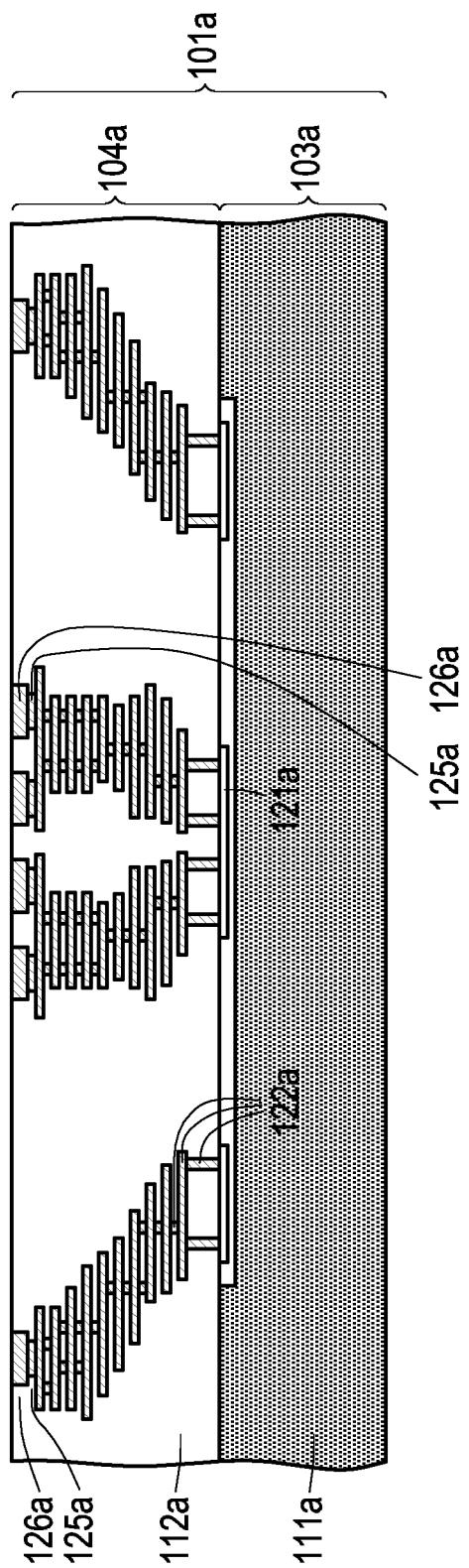
FIG. 1A to FIG. 1D are cross-sectional views of a method of forming a package structure in accordance with a first embodiment of the present invention.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1A to FIG. 1D are cross-sectional views of a method of forming a die stack structure in accordance with a first embodiment of the present invention.

Referring to FIG. 1A, a first wafer 101a is provided. The first wafer 101a may be an application-specific integrated circuit (ASIC) chip, an analog chip, a sensor chip, a wireless and radio frequency chip, a voltage regulator chip or a memory chip. The first wafer 101a includes a first semiconductor substrate 103a, a first device region 121a, a first interconnect structure 104a with first dielectric layers 112a and first interconnect wirings 122a embedded in the first dielectric layers 112a. The first interconnect wirings 122a may include first conductive vias 125a and first conductive pads 126a. The first conductive pads 126a are electrically connected to the first semiconductor substrate 103a through the first interconnect wirings 122a of the first interconnection structure 104a. In some embodiments, the material of the first interconnect wirings 122a may be copper (Cu) or other suitable metallic material while the material of the first dielectric layers 112a may be silicon oxide ($SiO_x$, where x>0), silicon nitride ($SiN_x$, where x>0), silicon oxynitride ($SiO_xN_y$, where x>0 and y>0) or other suitable dielectric material.

In some embodiments, the first semiconductor substrate 103a includes isolation structures defining at least one active area, and a first device layer is disposed on/in the active area. The first device region 121a includes a variety of devices. In some embodiments, the devices include active components, passive components, or a combination thereof. The devices are, for example, transistors, capacitors, resistors, diodes, photodiodes, fuse devices, or other similar devices. The functions of the devices may include memory, processors, sensors, amplifiers, power distribution, input/output circuitry, or the like. In some embodiments, the first device layer includes a gate structure, source/drain regions, spacers, and the like.

In some embodiments, the semiconductor substrate 103a may include silicon or other semiconductor materials. Alternatively, or additionally, the first semiconductor substrate 103a may include other elementary semiconductor materials such as silicon germanium, silicon carbide, gallium arsenic, indium arsenide, gallium nitride or indium phosphide. In some embodiments, the first semiconductor substrate 103a is made of an alloy semiconductor such as silicon germanium, silicon germanium carbide, gallium arsenic phosphide, or gallium indium phosphide. In some embodiments, the first semiconductor substrate 103a includes an epitaxial layer. For example, the first semiconductor substrate 103a has an epitaxial layer overlying a bulk semiconductor. In some embodiments, the first semiconductor substrate 103a is a semiconductor-on-insulator (SOI) substrate. In various embodiments, the first semiconductor substrate 103a may take the form of a planar substrate, a substrate with multiple fins, nanowires, or other forms known to people having ordinary skill in the art. Depending on the requirements of design, the first semiconductor substrate 103a may be a P-type substrate or an N-type substrate and may have doped regions therein. The doped regions may be configured for an N-type device or a P-type device.

Referring to FIG. 1A, the first interconnect structure 104a is formed over the first semiconductor substrate 103a. In detail, the first interconnect structure 104a includes first dielectric layers 112a and first interconnect wirings 122a. The first interconnect wirings 122a are formed in the first dielectric layers 112a. In some embodiments, the first dielectric layers 112a includes silicon oxide, silicon oxynitride, silicon nitride, low dielectric constant (low-k) materials, a combination thereof, or the like. In some embodiments, the first interconnect wirings 122a include contact vias and metal lines and/or metal pads. In some embodiments, the first interconnect wirings 122a are formed by a dual damascene process. In alternative embodiments, the first interconnect wirings 122a are formed by multiple single damascene processes. In yet alternative embodiments, the first interconnect wirings 122a are formed by an electroplating process. The first interconnect wirings 122a may be made of tungsten (W), copper (Cu), copper alloys, aluminum (Al), aluminum alloys, or a combination thereof. In some alternatively embodiments, a barrier layer (not shown) may be formed between the first interconnect wirings 122a and the first dielectric layers 112a to prevent the material of the first interconnect wirings 122a from migrating into the first dielectric layers 112a or to the first device region 121a. A material of the barrier layer includes tantalum, tantalum nitride, titanium, titanium nitride, cobalt-tungsten (CoW) or a combination thereof, for example.

Figure 1B:
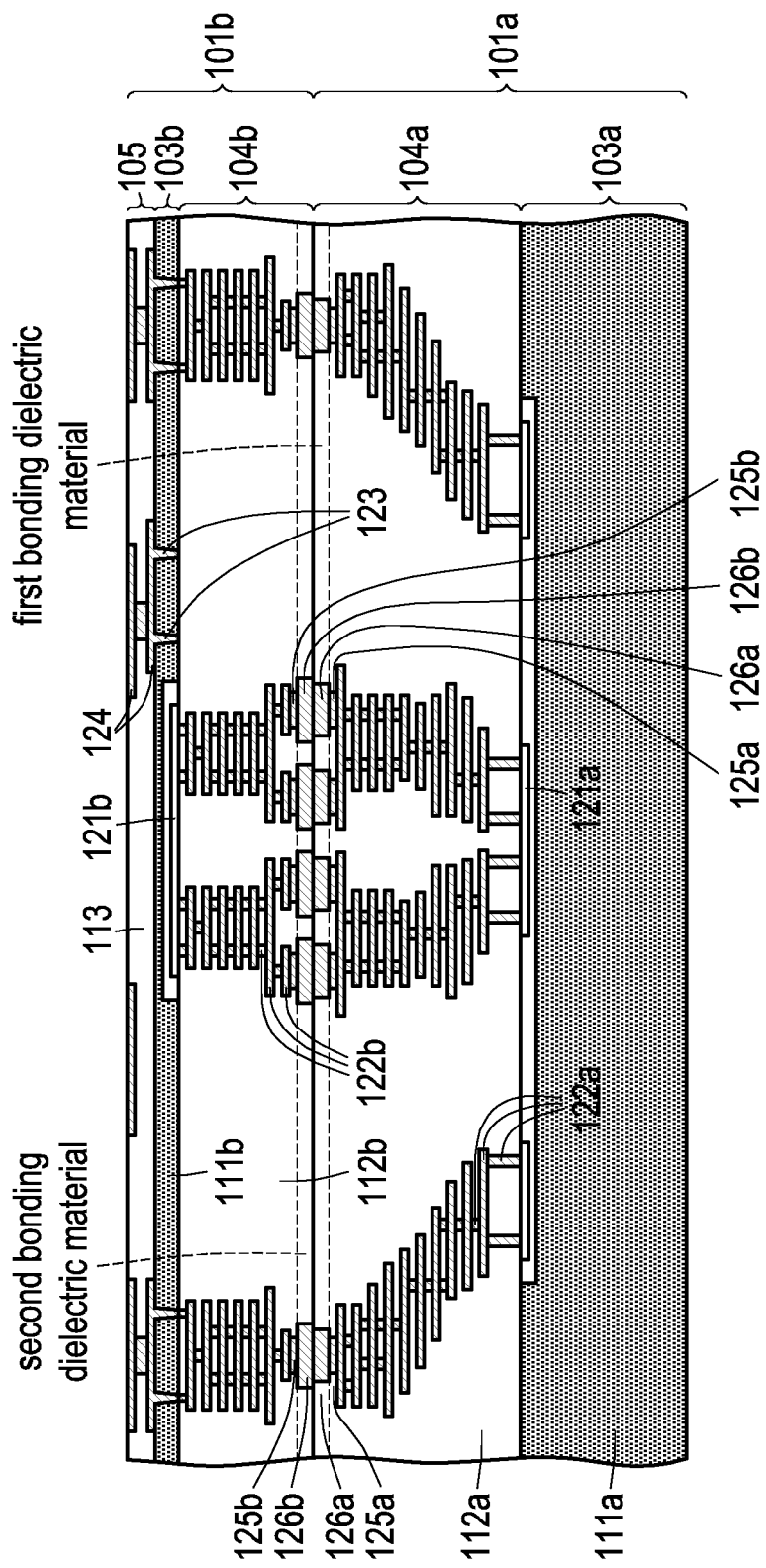
Figure 1C:
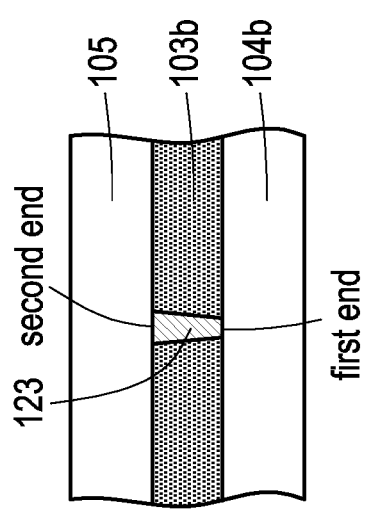

Referring to FIG. 1B and FIG. 1C, a second wafer 101b is provided. The second wafer 101b may be an application-specific integrated circuit (ASIC) chip, an analog chip, a sensor chip, a wireless and radio frequency chip, a voltage regulator chip or a memory chip, or the like. In some embodiments, the second wafer 101b works in a way like level two (L2) cache memory, or the like, to assist the first wafer 101a but within a separated wafer other than within a region in the first wafer. The second wafer 101b includes a second semiconductor substrate 103b, a second device region 121b, a second interconnect structure 104b with second dielectric layers 112b and second interconnect wirings 122b embedded in the second dielectric layers 112b. The second interconnect wirings 122b may include second conductive vias 125b and second conductive pads 126b. The second wafer 101b may further include a third interconnect structure 105 with third dielectric layers 113 and third interconnect wirings 124 embedded in the third dielectric layers 113. The material and the method of forming the interconnect structures 104b and 105 of the second wafer 101b can be similar to the interconnect structures 104a of the first wafer 101a or by other suitable materials and processes.

Moreover, in some embodiments, the second wafer 101b further includes through vias 123, as shown in FIG. 1B and FIG. 1C. The through vias 123 are electrically connected to the second interconnect structure 122b and the third interconnect structure 124. The through vias 123 penetrate through the second semiconductor substrate 103b, and the through vias 123 comprise first ends and second ends opposite to the first ends. It is to be noted that, the first ends of the through vias 123 are in contact with the second interconnect structure 104b, while the second ends of the through vias 123 are in contact with the third interconnect structure 105, and the second ends of the through vias 123 are wider than the first ends of the through vias 123. The through vias 123 may be made of copper, copper alloys, aluminum, aluminum alloys, or combinations thereof. In some other embodiments, the through vias 123 further include a diffusion barrier layer (not shown) surrounding the conductive vias. The diffusion barrier layer is made of Ta, TaN, Ti, TiN, CoW or a combination thereof, and may be formed by a suitable process such as electro-chemical plating process, CVD, atomic layer deposition (ALD), PVD or the like.

Figure 1D:
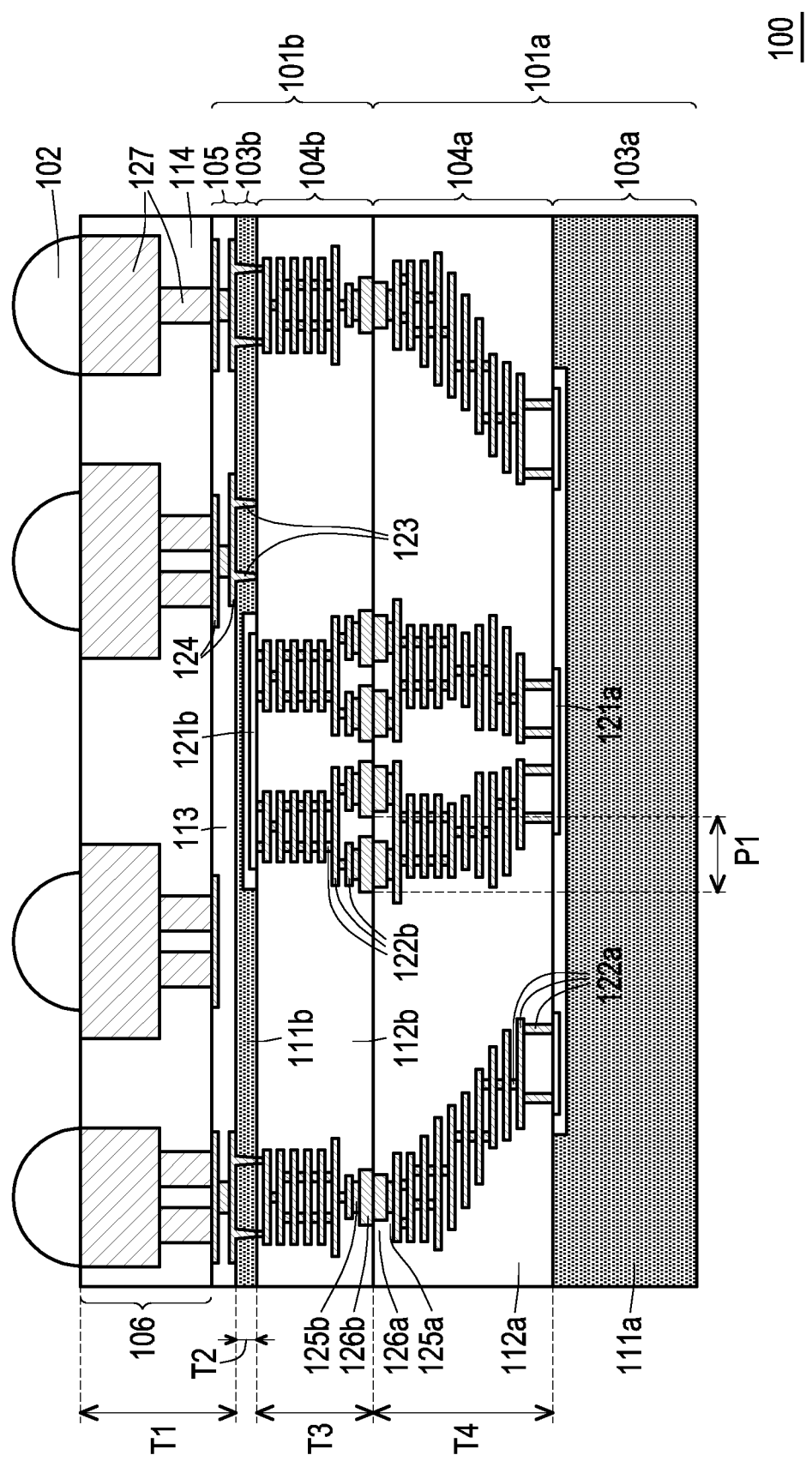

In some embodiments, in order to minimize the distance between the device regions 121a and 121b, the thicknesses T3 and T4 of interconnect structures 104a and 104b, as shown in FIG. 1D, are constrained within a range of about 0.5 μm to about 2 um or about 0.5 μm to about 3 um, so that the signal interaction latency and the energy loss between device 121a and 121b may be reduced. Moreover, to facilitate the power delivery from outer systems, the third interconnect wirings 124 on the backside of the second wafer 101b can be designed with a power distribution network circuitry function. The power distribution network (PDN) circuitry is configured to transmit power and ground signals to the devices in each semiconductor wafers 101a and 101b. In some embodiments, the power and ground signals fed to the device regions 121b and/or device regions 121a are provided from a back side of the substrate 103b, which is opposite to the front side of the substrate 103b on which the device regions 121b. As compared to providing power and ground signals to the device regions 121b from above the stack of interconnect layers 122b, the power and ground signals can be provided to the device regions 121b along a shorter path from the back side of the substrate 103b, according to embodiments of the present disclosure. Moreover, since the power distribution network are disposed at the backside of semiconductor substrate 103b and the device regions 121b, routing areas above the device regions 121b can be significantly released.

In some other embodiments, the thickness (T2) of second semiconductor substrate 103b may be reduced to less than about 0.5 um or 0.1 um, which is thinner than the second interconnect structure 104b in some embodiments. Besides the reduction of vertical distance between devices 121a and 121b, the horizontal spacing and critical dimensions of the interconnect structures 126a and 126b can be also reduced to having a pitch P1 (spacing plus critical dimension) less than about 3 um or 5um and thus the freedom and flexibility of design can be enhanced. The components in second device region 121b may have small thickness and/or may have portions above silicon substrate, so the second semiconductor substrate 103b can be thinner. For example, since channels of gate-all-around (GAA) transistors are located above a silicon substrate, not embedded in the silicon substrate, the silicon substrate can be thinner.

Referring to FIG. 1B, first conductive pads 126a are formed over a front side of the first wafer 101a and second conductive pads 126b are formed over a front side of the second wafer 101b. In detail, as shown in FIG. 1B, a portion of dielectric material 112a (or referred as a first bonding dielectric material) is disposed over the front side of the first wafer 101a, and the first conductive pads 126a are embedded in the first bonding dielectric material, for example. In some embodiments, the material of the first conductive pads 126a and the second conductive pads 126b may be copper (Cu) or other suitable metallic material while the material of the first bonding dielectric material and the second bonding dielectric material may be silicon oxide (SiO$_x$, where x>0), silicon nitride (SiN$_x$, where x>0), silicon oxynitride (Si-O$_x$N$_y$, where x>0 and y>0) or other suitable dielectric material. The first conductive pads 126a may be formed by deposition followed by chemical mechanical polishing (CMP) process. Similarly, the second conductive pads 126b may be formed by another deposition followed by chemical mechanical polishing process. The first conductive pads 126a and the second conductive pads 126b are helpful to adjust conductor density such that corrosion and/or dishing issue may be minimized.

Before the second wafer 101b is disposed on the first wafer 101a, the first conductive pads 126a, as a portion of the first metal features 122a, are exposed by the first bonding dielectric material. Also, the second conductive pads 126b are exposed by the second bonding dielectric material. In some embodiments, the second conductive pads 126b are electrical connected to the first conductive pads 126a by approaches with dielectric-to-dielectric and metal-to-metal bonding (e.g., pad-to-pad bonding). Before the bonding process, a cleaning process and a pre-bonding process for the first wafer 101a and the second wafer 101b are performed. In other words, the first conductive pads 126a on the first wafer 101a and the second conductive pads 126b on the second wafer 101b are aligned in advance before bonding.

In some embodiments, to facilitate bonding, surface preparation for bonding surfaces of the first wafer 101a and the second wafer 101b is performed. The surface preparation may include surface cleaning and activation, for example. Surface cleaning may be performed on the bonding surfaces of the first wafer 101a and the second wafer 101b so as to remove particles on top surfaces of the first conductive pads 126a, the first bonding dielectric material, the second conductive pads 126b and the second bonding dielectric material. The bonding surfaces of the first wafer 101a and the second wafer 101b may be cleaned by wet cleaning. Not only particles are removed, but also native oxide formed on the top surfaces of the first conductive pads 126a and the second conductive pads 126b may be removed. The native oxide formed on the top surfaces of the first conductive pads 126a and the second conductive pads 126b may be removed by chemicals used in the wet cleaning.

After cleaning the bonding surfaces of the first wafer 101a and the second wafer 101b, activation of the top surfaces of the first bonding dielectric material and the second bonding dielectric material may be performed for development of high bonding strength. In some embodiments, plasma activation is performed to treat the top surfaces of the first bonding dielectric material and the second bonding dielectric material.

Referring to FIG. 1B, the first wafer 101a is aligned with the second wafer 101b and sub-micron alignment precision may be achieved. Once the first wafer 101a and the second wafer 101b are aligned precisely, the second wafer 101b is placed on and in contact with the first wafer 101a. When the activated top surface of the first bonding dielectric material is in contact with the activated top surface of the second bonding dielectric material, the first bonding dielectric material of the first wafer 101a and the second bonding dielectric material of the second wafer 101b are pre-bonded. In other words, the first wafer 101a and the second wafer 101b are pre-bonded through the pre-bonding of the first bonding dielectric material and the second bonding dielectric material. After the pre-bonding of the first bonding dielectric material and the second bonding dielectric material, the first conductive pads 126a are in contact with the second conductive pads 126b.

After pre-bonding the second wafer 101b onto the first wafer 101a, a dielectric-to-dielectric and metal-to-metal bonding of the first wafer 101a and the second wafer 101b is performed. The dielectric-to-dielectric and metal-to-metal bonding of the first wafer 101a and the second wafer 101b may include a treatment for dielectric bonding and a thermal annealing for conductor bonding. In some embodiments, the treatment for dielectric bonding is performed to strengthen the bonding between the first bonding dielectric material and the second bonding dielectric material. For example, the treatment for dielectric bonding is performed at temperature ranging from about 100 Celsius degree to about 150 Celsius degree. After performing the treatment for dielectric bonding, the thermal annealing for conductor bonding is performed to facilitate the bonding between the first conductive pads 126a and the second conductive pads 126b. For example, the thermal annealing for conductor bonding may be performed at temperature ranging from about 300 Celsius degree to about 400 Celsius degree. The process temperature of the thermal annealing for conductor bonding is higher than that of the treatment for dielectric bonding. Since the thermal annealing for conductor bonding is performed at relative higher temperature, metal diffusion and grain growth may occur at bonding interfaces between the first conductive pads 126a and the second conductive pads 126b. On the other hand, when the thermal annealing for conductor bonding is performed, the first conductive pads 126a and the second conductive pads 126b may suffer pressure resulted from the coefficient of thermal expansion (CTE) mismatch between the conductors (126a, 126b) and the dielectric layers (112a, 112b). After performing the thermal annealing for conductor bonding, the first bonding dielectric material is bonded to the second bonding dielectric material and the first conductive pads 126a are bonded to the second conductive pads 126b. In some embodiments, the first conductive pads 126a include conductive pads (e.g., copper pads), conductive vias (e.g., copper vias), or the combinations thereof while the second conductive pads 126a include conductive pads (e.g., copper pads), conductive vias (e.g., copper vias), or the combinations thereof. The conductor bonding between the first wafer 101a and the second wafer 101b may be via-to-via bonding, pad-to-pad bonding or via-to-pad bonding.

After the bonding of the first wafer 101a and the second wafer 101b is performed, the first interconnection structure 104a and the second interconnection structure 104b are electrically connected to each other through the first interconnect wirings 122a and the second interconnect wirings 122b. It is to be noted that, for simplification of drawing, the first wafer 101a and/or other elements described herein are illustrated with break lines horizontally at each side, as can be seen in FIG. 1A to 1C to represent that is a wafer form process. On the contrary, the structure shown in FIG. 1D is with straight lines at each horizontal side because a singulation process has been carried out on the structure.

Referring to FIG. 1D, after the first wafer 101a and the second wafer 101b are bonded, an interconnect structure 106 is formed over the back side of the second wafer 101b. The interconnect structure includes dielectric layers 114 and interconnect wirings 127 stacked alternately with electrical connection to the interconnect structures 122b and the through vias 123 of the second wafer 101b. In some embodiments, the topmost conductive layer of interconnect wirings 127 include metallic pads for mounting conductive connectors 102 (e.g., metal pillars, µ-humps, solder bumps, or a combination thereof) to be formed later, and a possible singulation may be carried out in the further processes. As a result of such singulation process, the interconnect structures 104a, 104b, 105, 106 and the semiconductor substrates 103a, 103b are cut along boundary (i.e., scribe lines) of the die region as designed. Accordingly, sidewalls of the interconnect structures 104a, 104b, 105, 106 may substantially align with sidewalls of the semiconductor substrates 103a, 103b, as shown in FIG. 1D.

Figure 2:
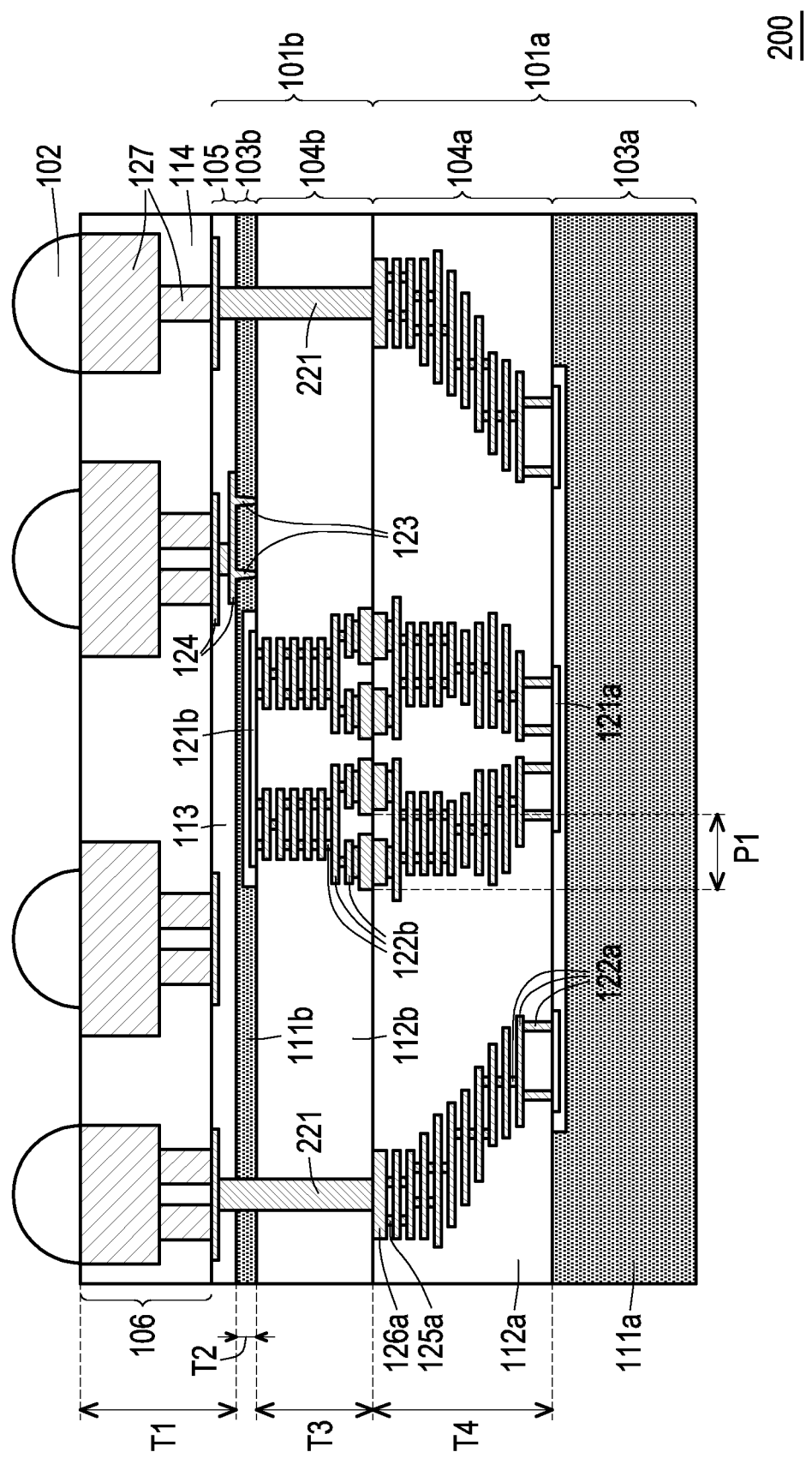
FIG. 2 is a cross-sectional view of a package structure in accordance with a second embodiment of the present invention.

In some embodiments, referring to the package structure 200 shown in FIG. 2, the second die 101b further includes second through vias 221 penetrating through the second semiconductor substrate 103b and the second interconnect structure 104b, and the second through vias 221 are electrically connected to the first interconnect structure 104a and the interconnect structure 106.

Figure 3A:
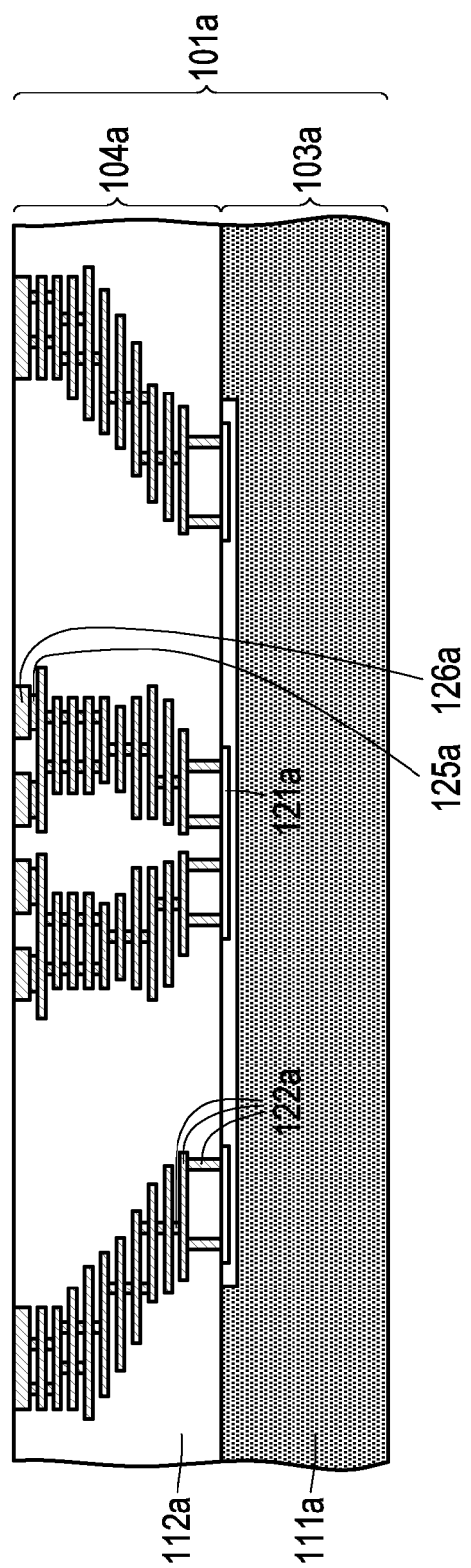
FIG. 3A to FIG. 3D are cross-sectional views of a method of forming a package structure in accordance with a third embodiment of the present invention.

The method of forming a package structure 300 is described in accompany with FIG. 3A to 3D. In FIG. 3A, a first semiconductor wafer 101a comprising a first semiconductor substrate 103a and a first interconnect structure 104a is provided, wherein the first interconnect structure includes first conductive pads 126a and first conductive vias 125a. In some embodiments, the conductive pads 126a can have various critical dimensions or even shapes for further electrical connection to the structures to be formed in following steps.

Figure 3B:
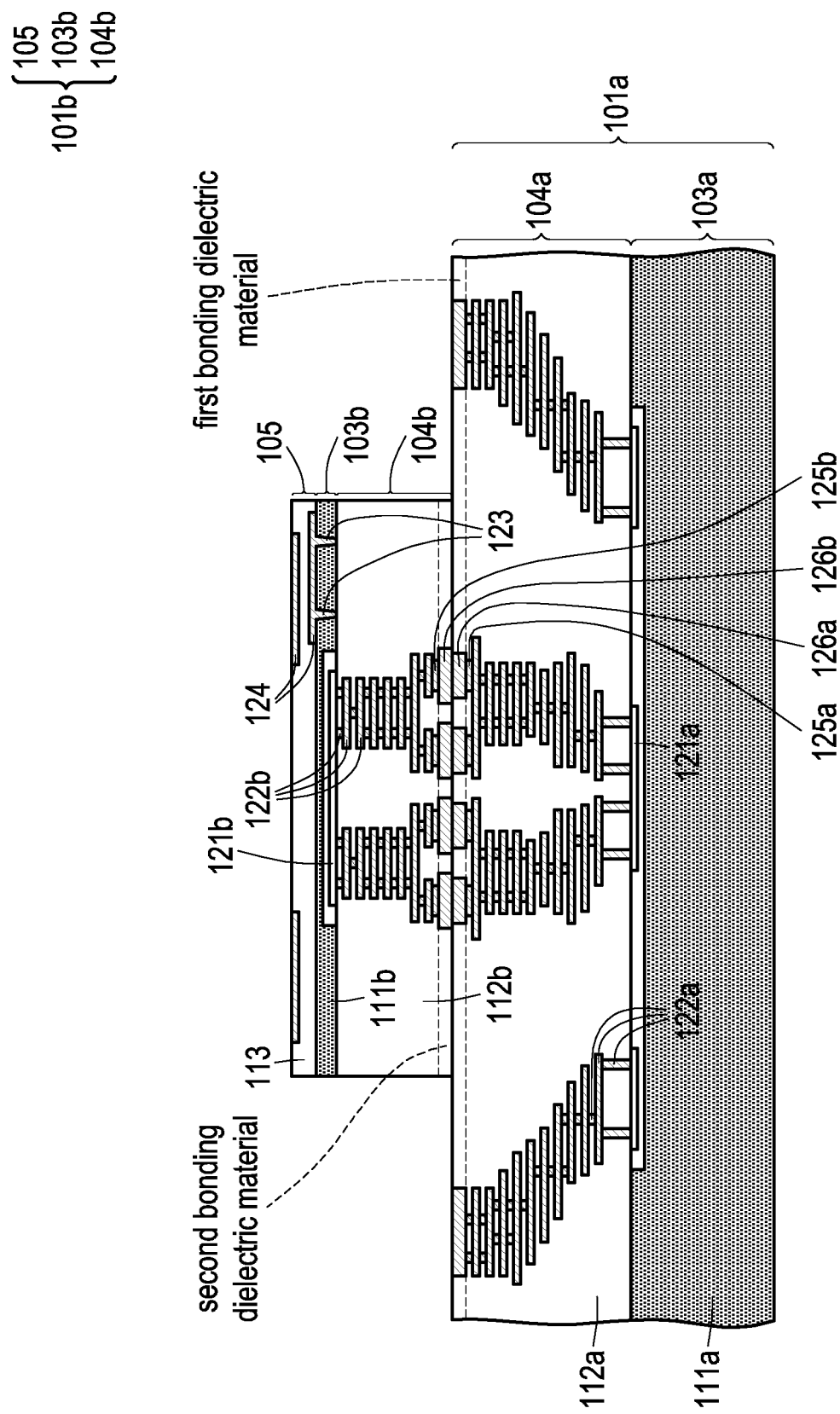

Referring to FIG. 3B, a second die 101b is picked-up and placed onto the first wafer 101a. In detail, the first wafer 101a and the second die 101b are face-to-face bonded together via the first conductive pads 126a and the second conductive pads 126b. In some embodiments, before performing the bonding of the first wafer 101a and the second die 101b, the first conductive pads 126a and the second conductive pads 126b are substantially aligned, and a sub-micron alignment precision may be achieved as described previously. The first conductive pads 126a may be bonded to the second conductive pads 126b, and the first bonding dielectric material may be bonded to the second bonding dielectric material. The alignment of the first conductive pads 126a and the second conductive pads 126b may be achieved by using an optical recognition method. After the alignment is achieved, in some embodiments, the first conductive pads 126a and the second conductive pads 126b are bonded together by the application of pressure and/or heat. In some embodiments, the bonding structure involves metal-to-metal bonding and dielectric-to-dielectric bonding. In some other embodiments, the bonding structure involves fusion bonding.

Figure 3C:
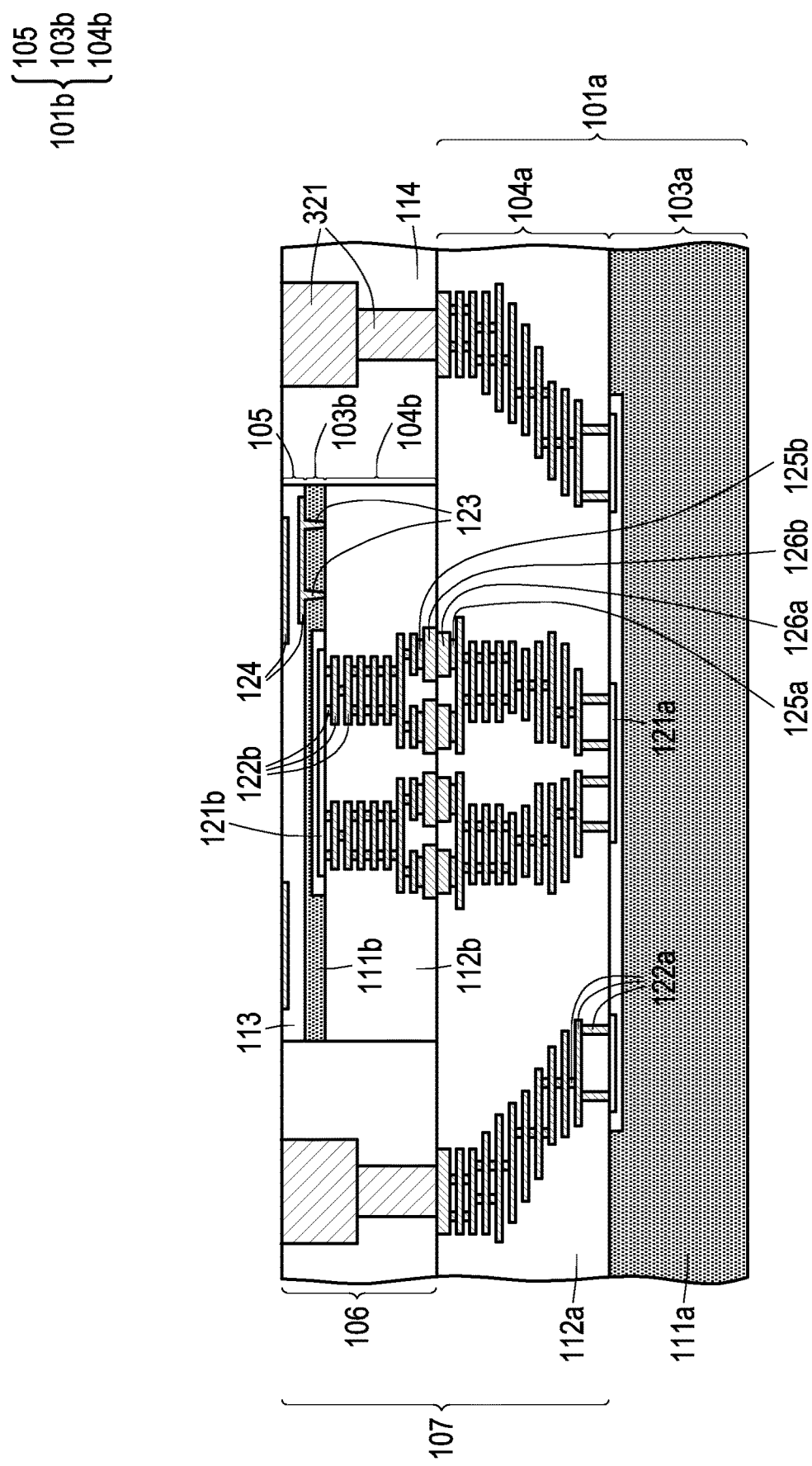

After the first wafer 101a and the second die 101b are bonded, as shown in FIG. 3C, the interconnect structure 106 comprising interconnect wirings 321 embedded in dielectric layers 114 is formed. In some embodiments, the dielectric layers 114 include silicon oxide, silicon nitride, polymer, or a combination thereof. The dielectric layers 114 may be formed by depositing a dielectric material through a suitable process such as spin coating, CVD or the like, and then the deposited dielectric material may be partially removed by performing a planarization process. In some embodiments, the planarization process includes a CMP process, an etching back process, or a combination thereof. In some embodiments, during the planarization process, a portion of the dielectric material is removed, and the topmost portion of interconnect wirings 321 and/or the topmost portion of wafer 101b, that is, a portion of the interconnect structure 105 comprising the dielectric layer 113 and the third interconnect wirings 124 are also removed. In some other embodiments, during the planarization process, a portion of the dielectric material above the interconnect wirings 321 and 124 is not removed, and thus the interconnect wirings 321 and 124 are still covered by the dielectric material before the succeeding processes.

Figure 3D:
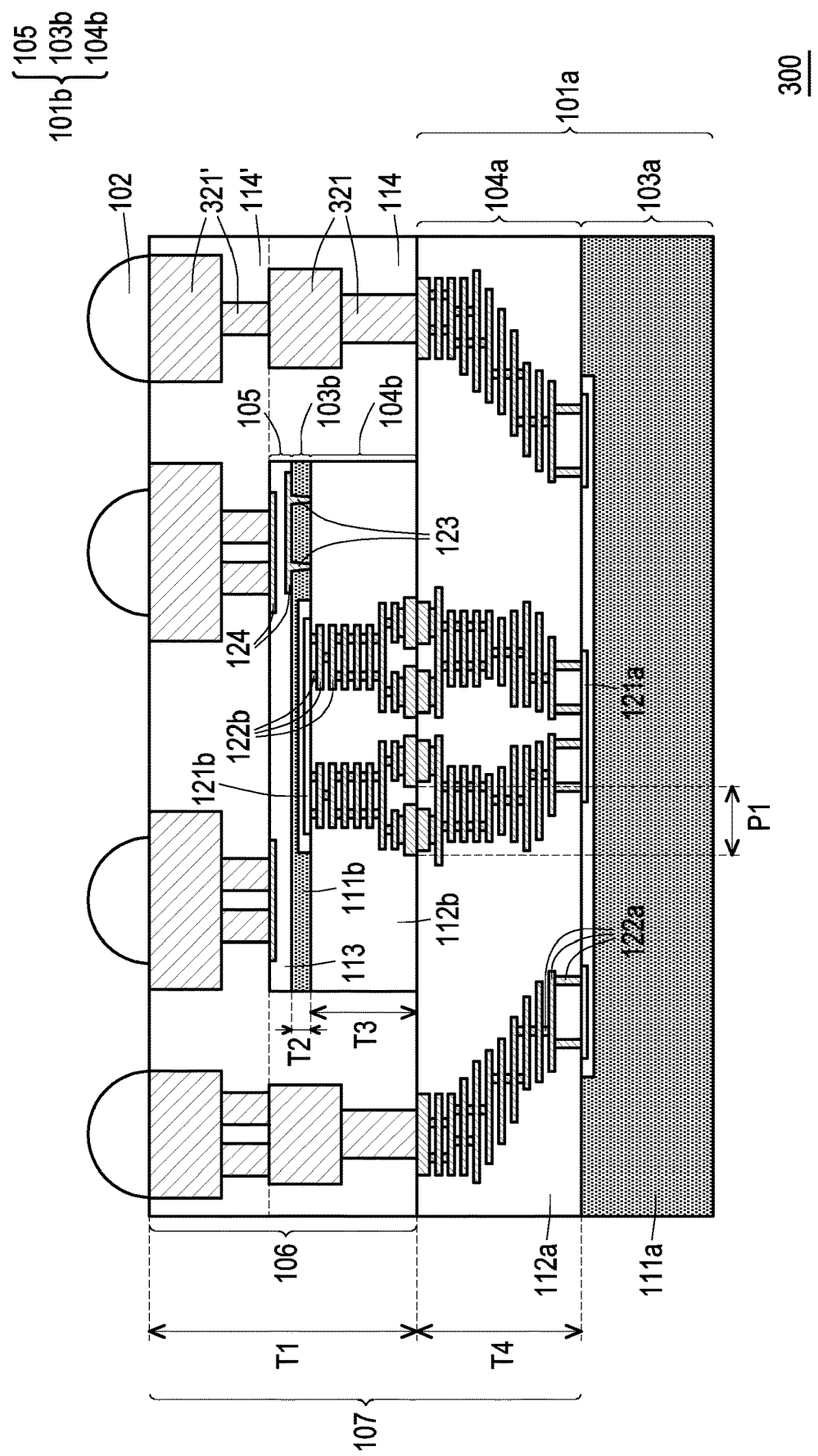

Referring to FIG. 3D, additional dielectric layers 114' comprising interconnect wirings 321' embedded therein are formed over the previously formed dielectric layer 114 and the second die 101b. The interconnect wirings 321' are electrically connected to the interconnect structures 122a. The interconnect wirings 321' may be electrically connected to the interconnect structures 122b of the second die 101b through various combinations of the interconnect structures 122a, the interconnect structures 124, the through vias 123 and/or through vias 221 (if existing in the second die 101b). In some embodiments, the topmost conductive layer of interconnect wirings 321' includes metallic pads for mounting conductive connectors 102 (e.g., metal pillars, µ-bumps, solder bumps, controlled collapse chip connection (C4) bumps, ball-grid array (BGA) balls or the like). A possible singulation may be performed in the further processes. As a result of such singulation process, the interconnect structures 104a, 106 and the semiconductor substrates 103a are cut along boundary (e.g., scribe lines) of the die regions as designed. Accordingly, sidewalls of the interconnect structure 104a, sidewalls of the interconnect structure 106 and the semiconductor substrates 103a may be substantially coplanar with each other in the package structure 300 shown in FIG. 3D.

As shown in FIG. 3D, the package structure 300 is formed after the singulation process. The first semiconductor die 101a comprises a first semiconductor substrate 103a and a first interconnect structure 104a. The first interconnect structure 104a comprises first dielectric layers 112a stacked on the first semiconductor substrate 103a with first interconnect wirings 122a embedded in the first dielectric layers 112a, and second dielectric layers 114 and 114' are stacked on the first dielectric layers, with interconnect wirings 321 and 321' embedded in the second dielectric layers 114 and 114'. In this package structure 300, the second semiconductor die 101b is disposed on the first dielectric layers 112a and embedded in the second dielectric layers 114 and 114' with an interconnect structure 104b electrically connected to the first interconnect wirings 122a, and the third interconnect structure 105 is electrically connected to the interconnect wirings 122b by through vias 123 and/or by the second interconnect wirings 321.

Figure 4A:
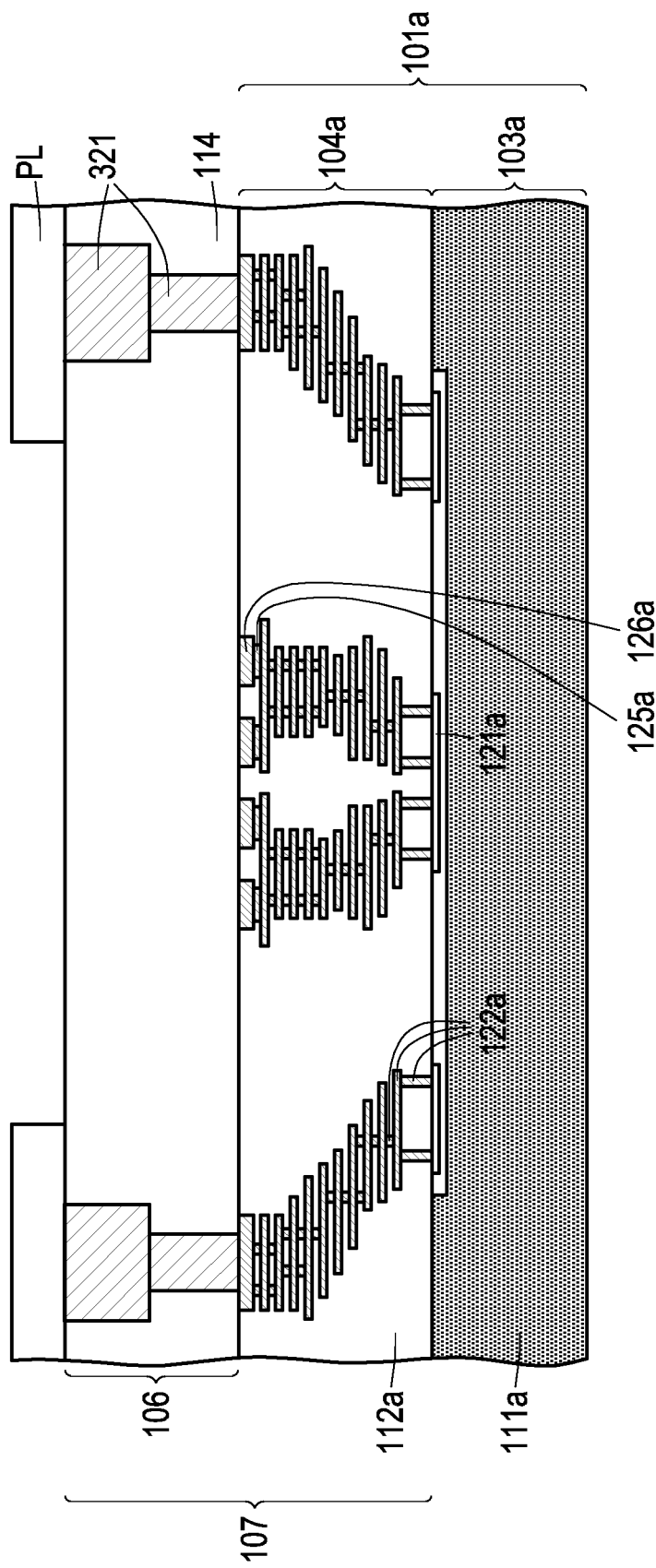
FIG. 4A to FIG. 4D are cross-sectional views of a method of forming a package structure in accordance with another embodiment of the present invention.

The method of forming package structure 400 is described by FIG. 4A to 4D. In FIG. 4A, the first semiconductor wafer 101a comprising a first semiconductor substrate 103a and a first interconnect structure 104a with first conductive pads 126a are formed in a similar way as in FIG. 3A. In some embodiments, the conductive pads 126a may have various critical dimensions or even different shapes for further electrical connection to the structures that to be formed in following steps, such as the interconnect wiring structure 321 shown in FIG. 4A, for example. Above the first interconnect structure 104a, the second interconnect structure 106 comprising dielectric layers 114 with interconnect wirings 321 embedded in dielectric layers 114 is formed. A patterning process is then performed to create a cavity in dielectric layers 114, in order to place the second semiconductor die 101b. The patterning process can be a combination of lithography process, etching processes and/or other suitable processes. The lithography patterning processes may include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes may include dry etching processes, wet etching processes, other etching processes, or combinations thereof. As an exemplary embodiment, a layer PL is shown in the FIG. 4A to FIG. 4B to assist the patterning process of the interconnect structure 106. PL can be a hard mask, a photo resist or the like, for example.

Figure 4B:
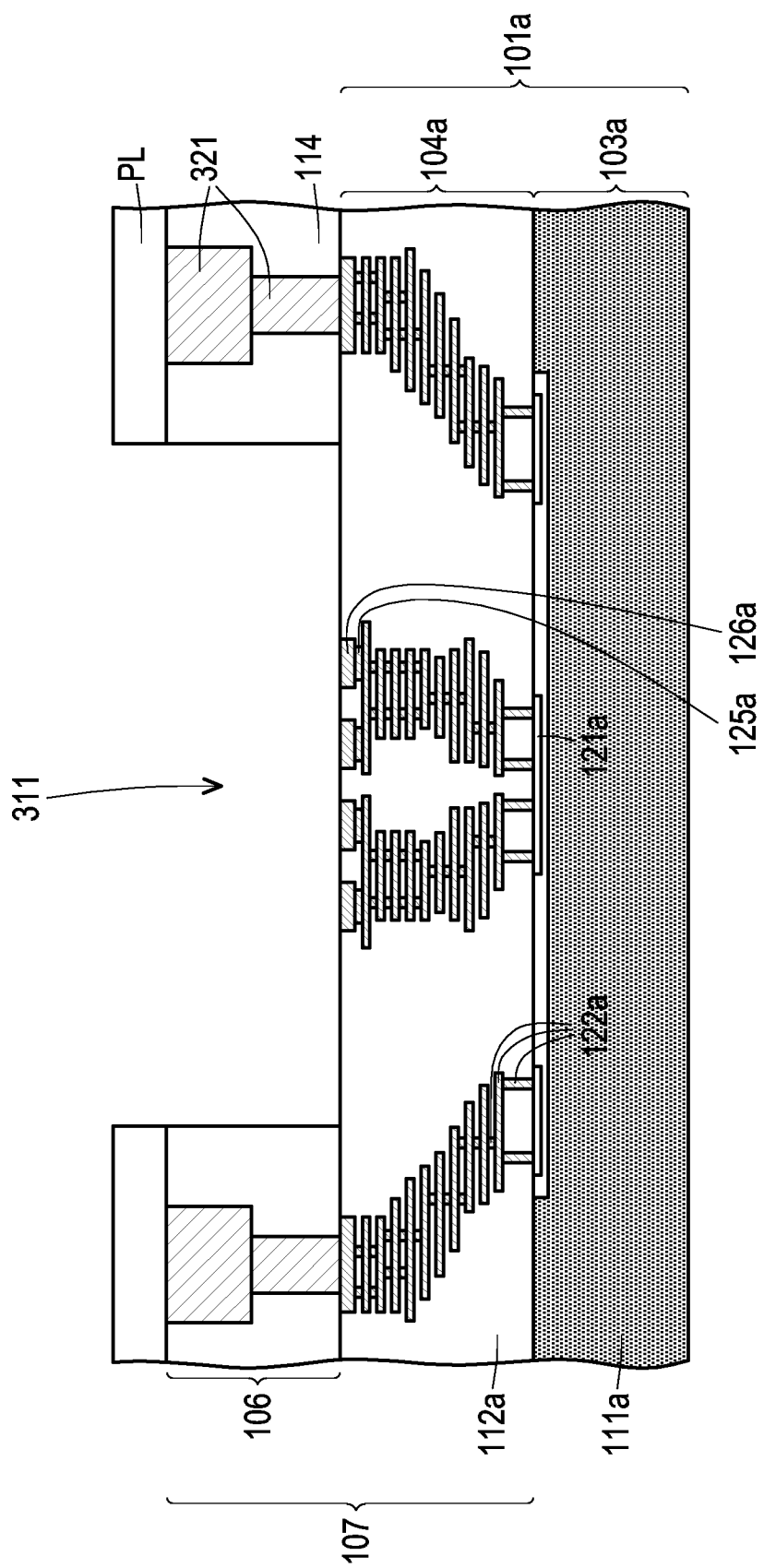
Figure 4C:
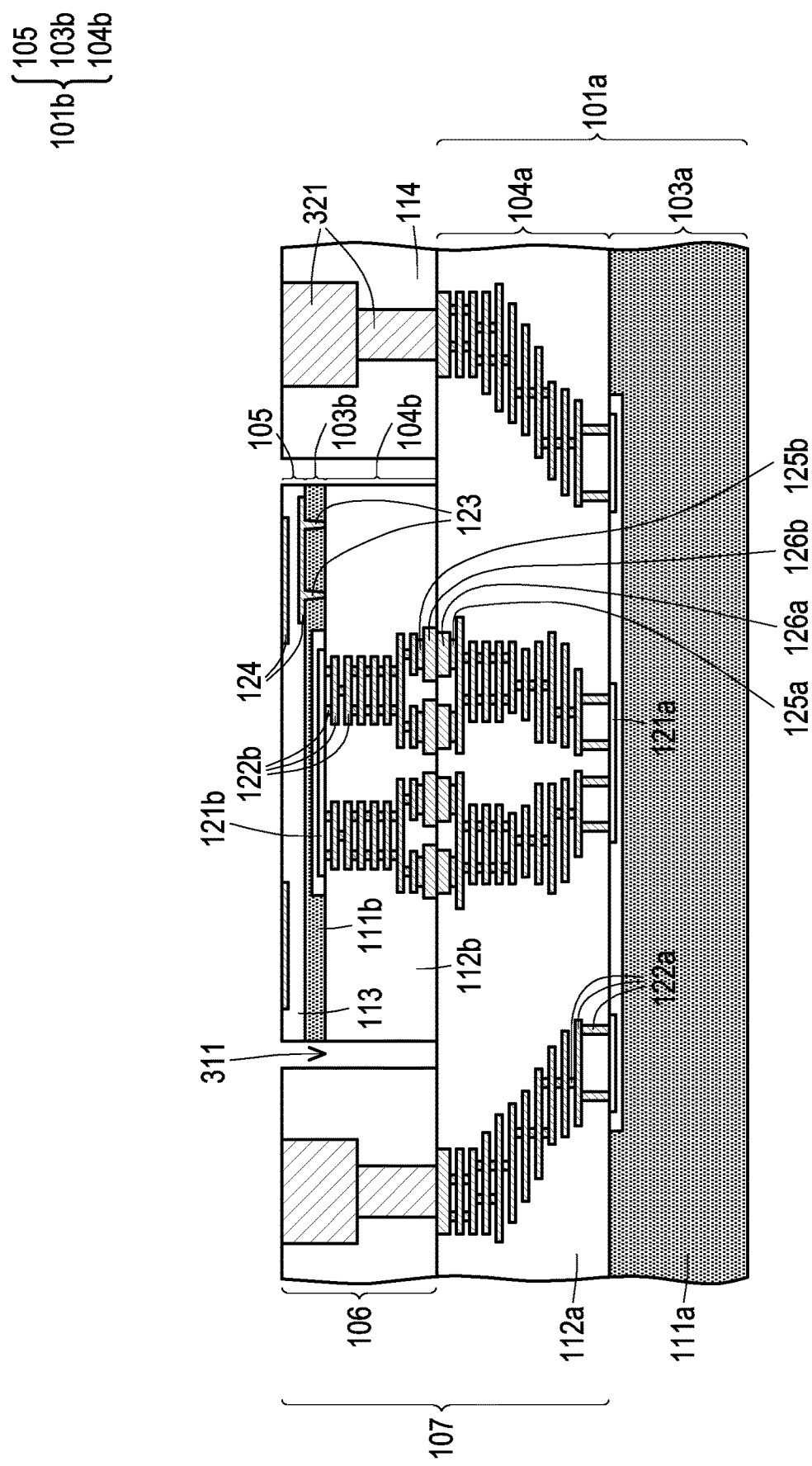
Figure 4D:
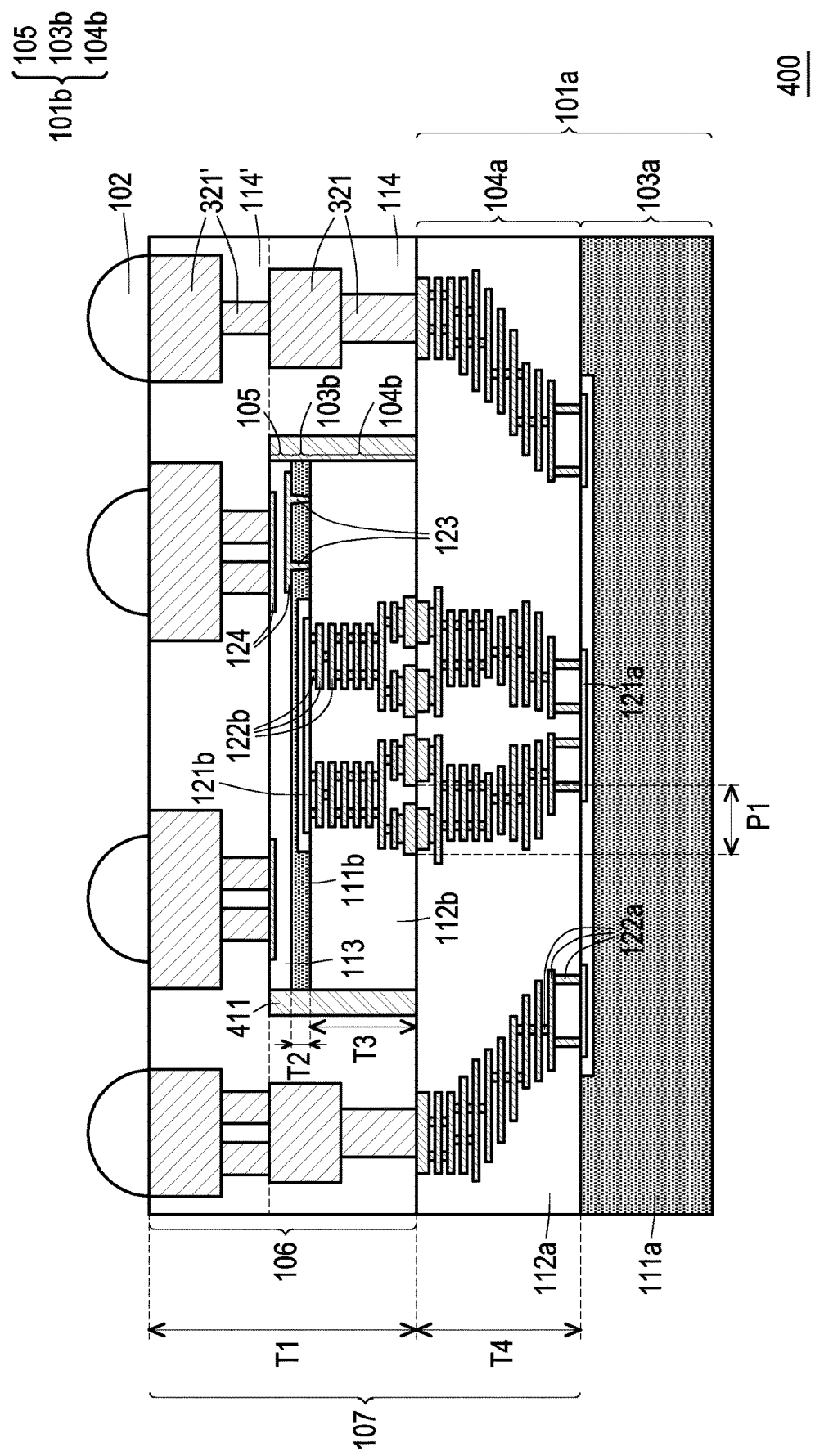

Referring to FIG. 4B, a cavity 311 is formed in the dielectric layers 114 so that the second die 101b can be placed above the interconnect structure 104a, as shown in FIG. 4C. The opening size of cavity 311 should be the size of the second die 101b plus a process variation, without touching the neighboring interconnect wirings 321, so that there might be still a vacancy between the second die 101b and the dielectric layer 114, as shown in FIG. 4C. An encapsulant 411 might be filled in the vacancy between the second die 101b and the dielectric layer 114 after the second die 101b is placed, as shown in FIG. 4D. The encapsulant 411 may physically contact the sidewalls of the second die 101b. The encapsulant 411 may be formed by chemical vapor deposition (CVD) process followed by chemical mechanical polishing (CMP) process, or other suitable processes. In some embodiments, the encapsulant 411 may be a single-layered structure and the material of the encapsulant 411 may include silicon oxide, silicon nitride, tetraethoxysilane (TEOS), and/or some other suitable materials.

As shown in FIG. 4D, after forming the encapsulant 411 and planarization, additional dielectric layers 114' comprising interconnect wirings 321' embedded therein are formed over the previously formed dielectric layer 114, the top surface of the encapsulant 411 and the rear surfaces of the second semiconductor die 101b. The interconnect structure 106 may have electrical connection to the interconnect structures 122a, and may also be electrically connected to the interconnect structures 122b of the second die 101b through the combination of the interconnect structures 122a, the interconnect structures 124, the through vias 123 and/or through vias 221 (if existing in the second die 101b). In some embodiments, the topmost conductive layer of interconnect structure 106 includes metallic pads for mounting conductive connectors 102 (e.g., metal pillars, μ-bumps, solder bumps, controlled collapse chip connection (C4) bumps, ball-grid array (BGA) balls or the like). A possible singulation may be performed in the further processes. As a result of such singulation process, the interconnect structures 104a, 106 and the semiconductor substrates 103a are cut along boundary (e.g., scribe lines) of the die regions as designed. Accordingly, sidewalls of the interconnect structure 104a, sidewalls of the interconnect structure 106 and the semiconductor substrates 103a may be substantially coplanar with each other in the package structure 400 shown in FIG. 4D.

In other words, as the package structure 400 shown in FIG. 4D, the first semiconductor die 101a comprises a first semiconductor substrate 103a and a first interconnect structure 104a. The first interconnect structure 104a comprises first dielectric layers 112a stacked on the first semiconductor substrate 103a with first interconnect wirings 122a embedded in the first dielectric layers 112a, and second dielectric layers 114 and 114' stacked on the first dielectric layers, with second interconnect wirings 321 and 321' embedded in. In this package structure 400, the second semiconductor die 101b is disposed on the first dielectric layers 112a and embedded in the second dielectric layers 114 and 114' with the second interconnect structure 104b electrically connected to the first interconnect wirings 122a, and the third interconnect structure 105 is electrically connected to the second interconnect wirings 122b. Within the dielectric layers 114, a dielectric material 411 is laterally encapsulating the second semiconductor die 101b.

Figure 5:
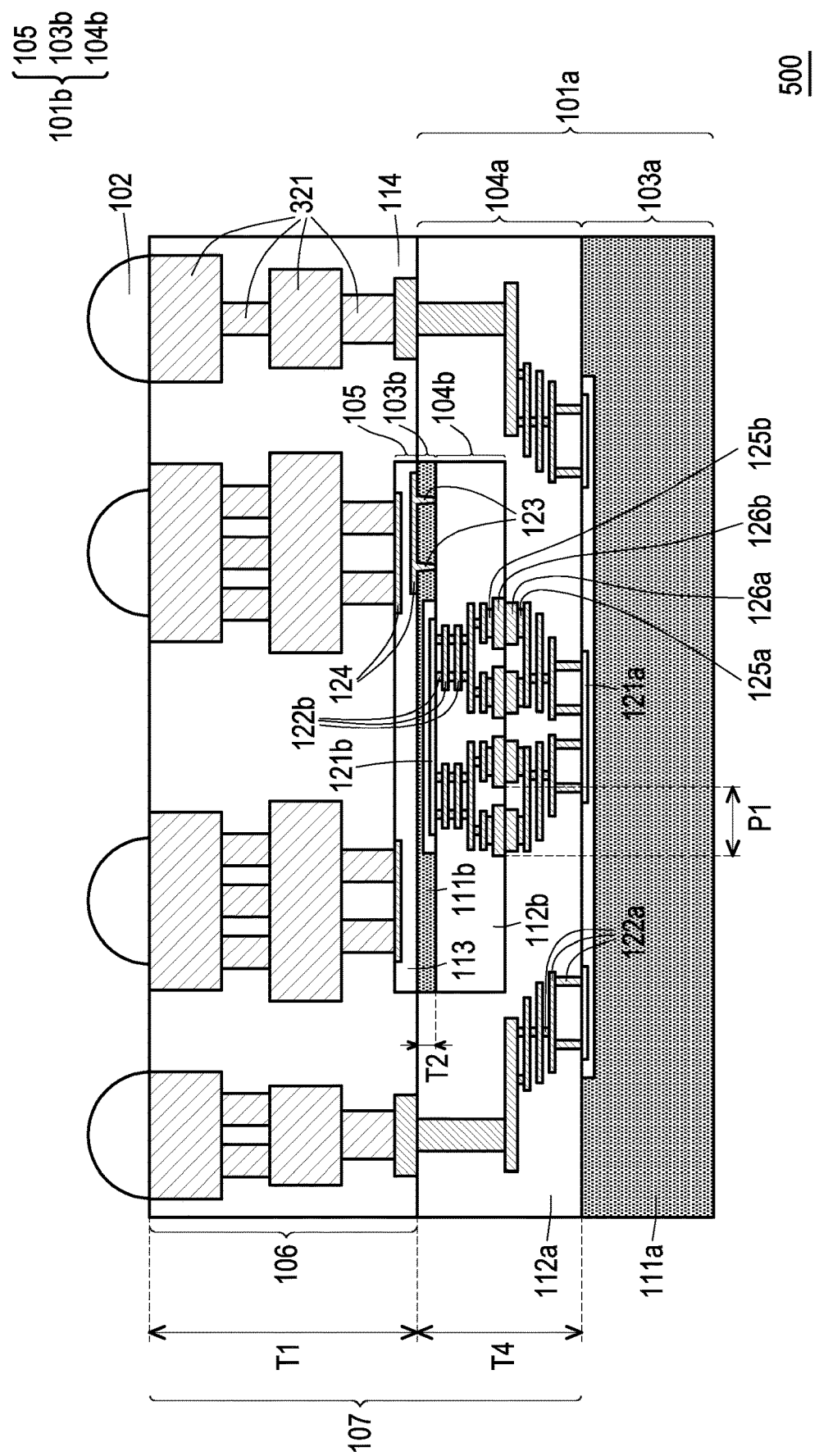
FIG. 5 is a cross-sectional view of a package structure in accordance with an embodiment of the present invention.

Referring to FIG. 5, a package structure 500 is demonstrated. Alike FIG. 3D, a second die 101b comprising a second semiconductor substrate 103b, a second device region 121b, a second interconnect structure 104b with second dielectric layers 112b and second interconnect wirings 122b embedded in the second dielectric layers 112b. The second interconnect wirings 122b may include second conductive vias 125b and second conductive pads 126b. The second die 101b further includes a third interconnect structure 105 with third dielectric layers 113 and third interconnect wirings 124 embedded in the third dielectric layers 113. Moreover, in some embodiments, the second die 101b further includes through vias 123, with which the interconnect wirings 122b and 124 can be electrical connected. The second die 101b may be an application-specific integrated circuit (ASIC) chip, an analog chip, a sensor chip, a wireless and radio frequency chip, a voltage regulator chip or a memory chip that might work in a way like level two (L2) cache memory or the like. Comparing to package structure 300, it is to be noted that the second die 101b is partially embedded in the interconnect structure 104a and partially embedded in the interconnect structure 106, instead of being placed above the interconnect structure 104a and embedded only in the interconnect structure 106.

Furthermore, interconnect wirings 321 are formed embedded in the dielectric layers 114 above the second die 101b. The interconnect wirings 321 may be with electrical connection to the interconnect structures 122a. The interconnect wirings 321 may also be electrically connected to the interconnect structures 122b of the second die 101b through the combination of the interconnect structures 122a, the interconnect structures 124, the through vias 123 and/or through vias 221 (if existing in the second die 101b). It is to be noted that, in interconnect wirings 122a there might be a layer of conductive line, or conductive via, or a set of conductive line and conductive via that is formed in a damascene process is of the same thickness with the second die 101b. In some embodiments, the topmost conductive layer of interconnect wirings 321 includes metallic pads for mounting conductive connectors 102 (e.g., metal pillars, μ-bumps, solder bumps, controlled collapse chip connection (C4) bumps, ball-grid array (BGA) balls or the like) that may comprise metal material such as aluminum, copper, nickel, gold, silver, solder, tin, lead, or a combination thereof. A package structure 500 is shown with above mentioned structures stacked in FIG. 5.

Figure 6:
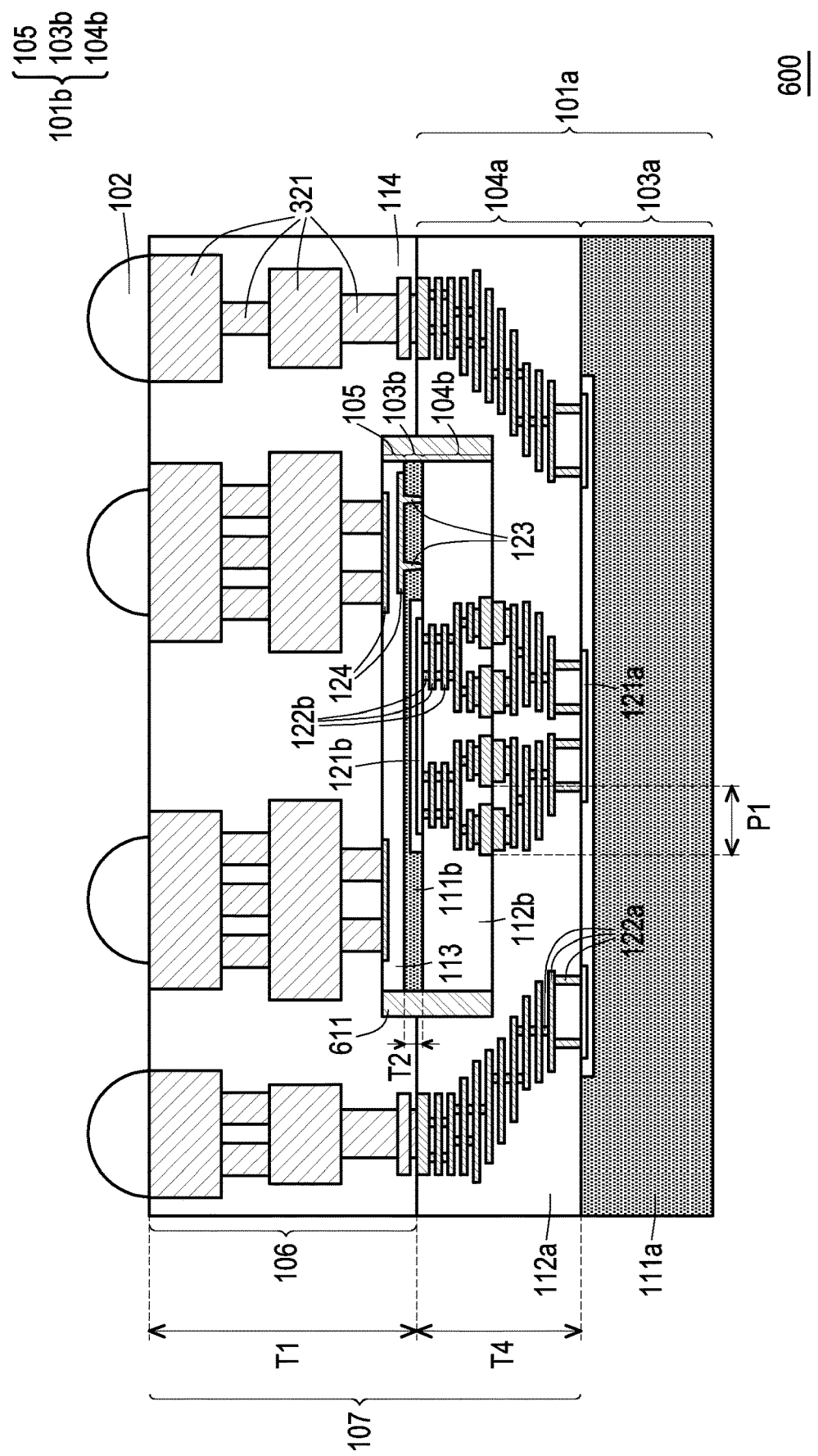
FIG. 6 is a cross-sectional view of a package structure in accordance with an embodiment of the present invention.

As shown in FIG. 6, another package structure 600 is demonstrated with a similar combination of semiconductor die 101a, 101b, interconnect structure 106 and conductive connectors 102. A difference comparing to the package structure 500 is that an encapsulant 611 is formed laterally encapsulating the second semiconductor die 101b. Encapsulant 611 may physically contact the sidewalls of the second die 101b and may be formed in a similar way and/or of similar materials with the encapsulant 411 shown in the package structure 400 in FIG. 4D.

Figure 7:
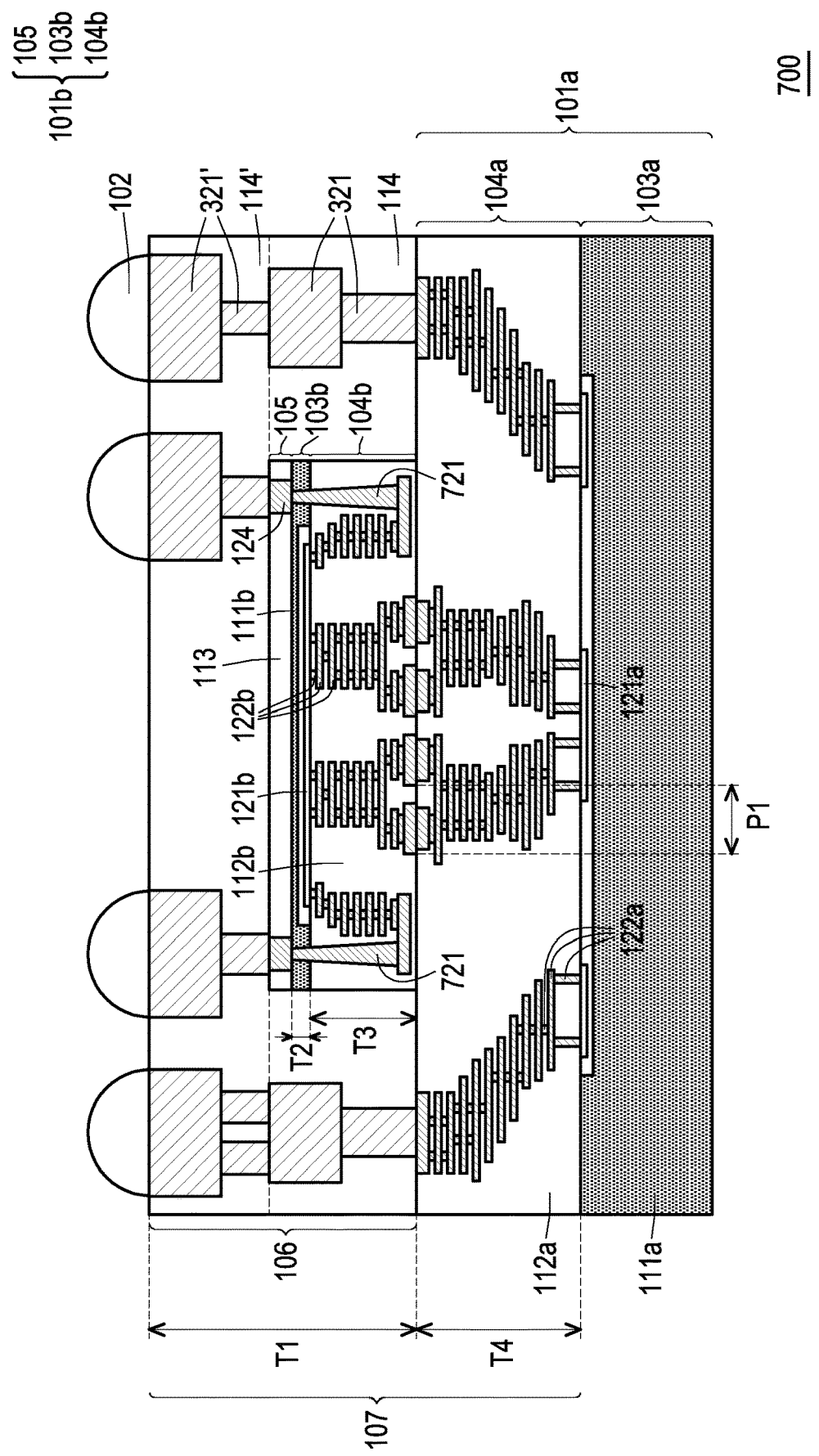
FIG. 7 is a cross-sectional view of a package structure in accordance with an embodiment.

Referring to FIG. 7, the package structure 700 is alike the package structure 300 except the through vias 123 are replaced by through vias 721 instead. As shown in the figure, the through vias 721 may penetrate the second semiconductor substrate 103b and be electrically connected to the interconnect wirings 124 at the backside of second die 101b, but be embedded in the interconnect structure 104b rather than being exposed by the interconnect structure 104b at the front side of the second die 101b. The interconnect wirings 321 can electrically connect to interconnect wirings 122a, interconnect wirings 122b, interconnect wirings 124 and/or the through vias 721.

Figure 8:
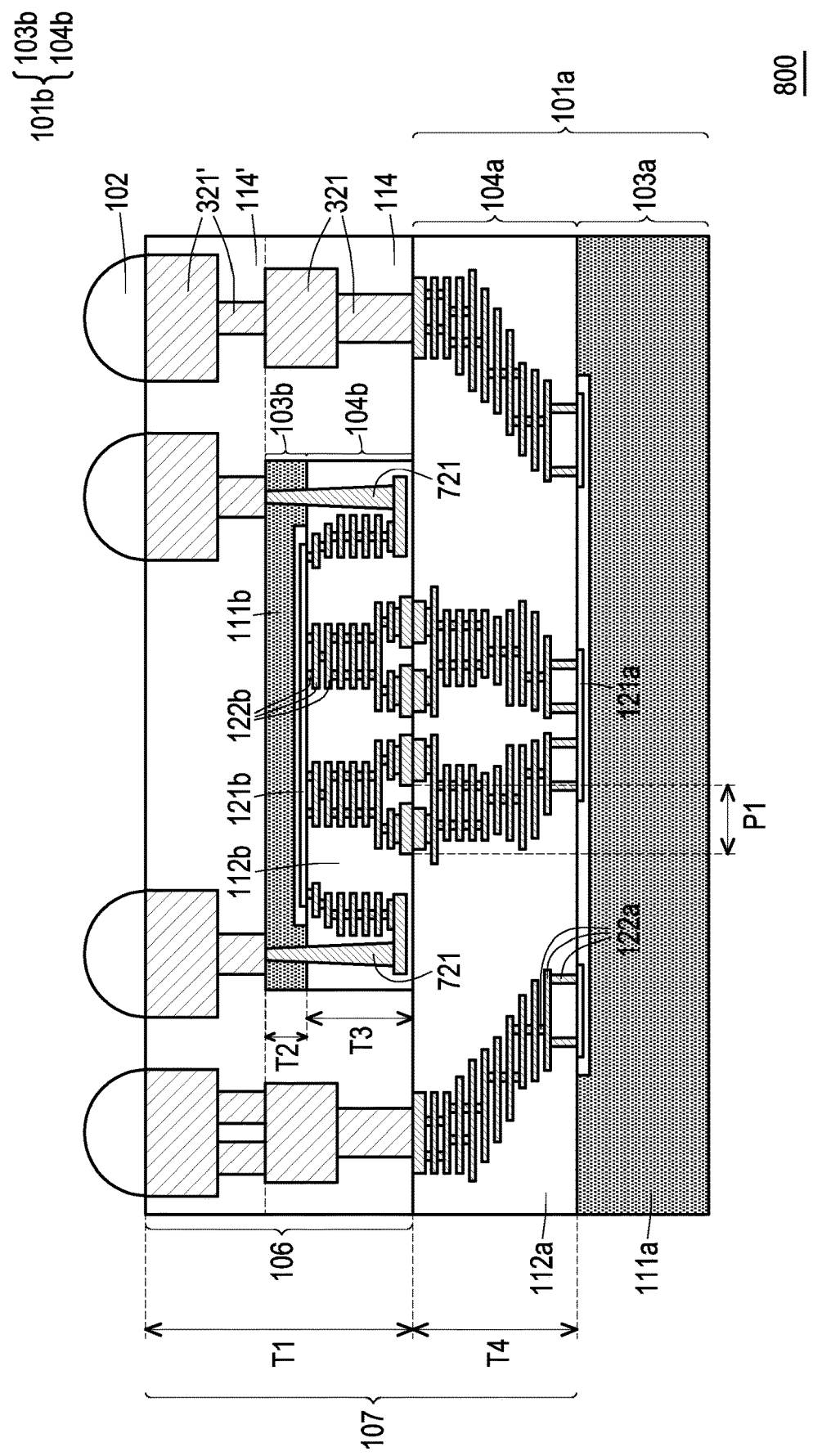
FIG. 8 is a cross-sectional view of a package structure in accordance with an embodiment of the present invention.

In FIG. 8, a package structure 800 is shown. The package structure 800 is alike the package structure 700 without the interconnect structure 105 and the embedded interconnect wirings 124 on the backside of second die 101b. In this package structure 800, the interconnect wirings 321 may directly contact with the through vias 721 to have electrical connection with the interconnect wirings 122b. To be noted that, there might be dielectric materials (not shown) covering the backside of the semiconductor structure 103b and laterally encapsulating the ends of through vias 721 under the interconnect wirings 321 as an insulating structure.

Figure 9:
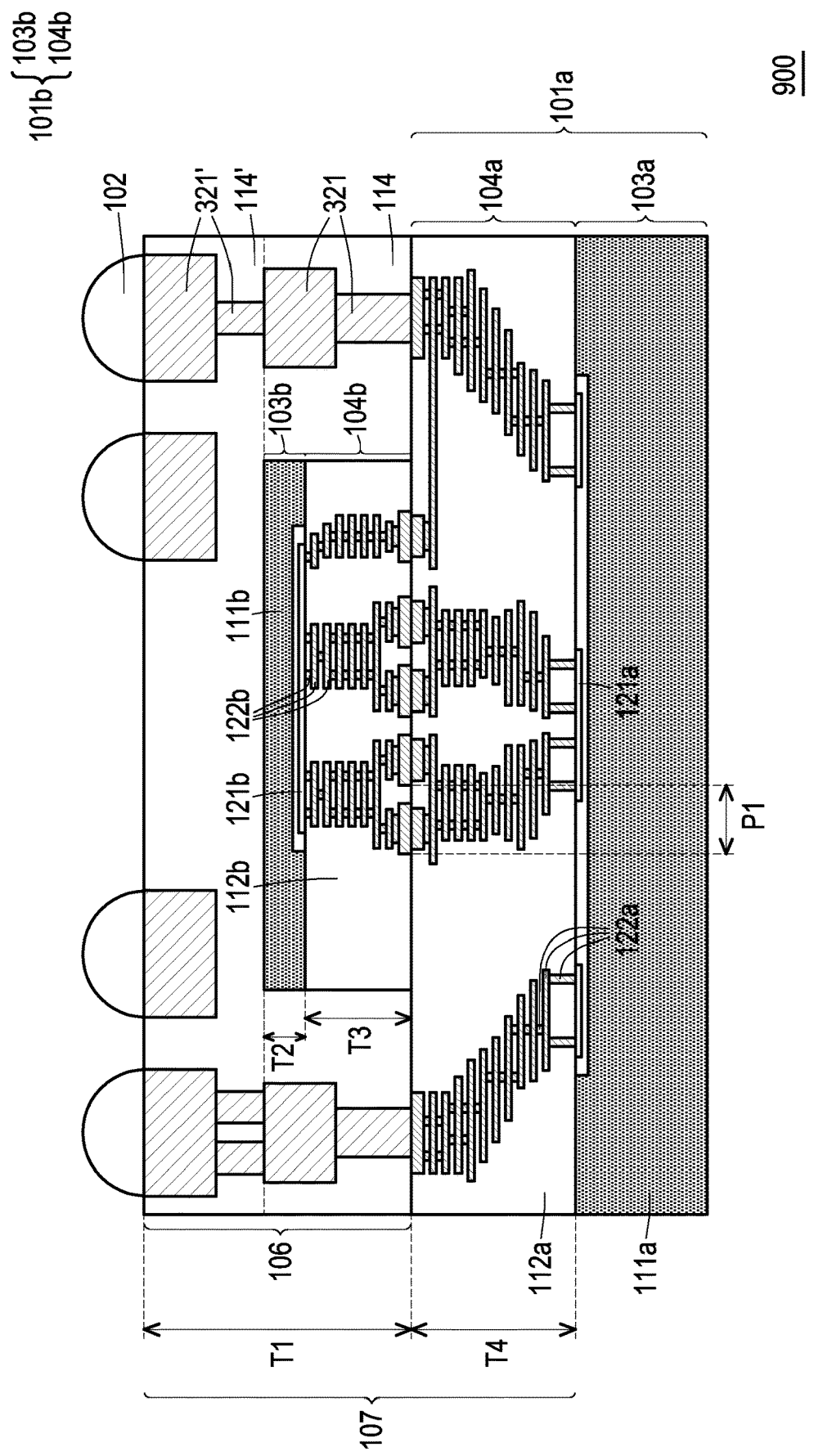
FIG. 9 is a cross-sectional view of a package structure in accordance with an embodiment of the present invention.

Referring to FIG. 9, the package structure 900 is shown with a combination of semiconductor die 101a, 101b, interconnect structure 106 and conductive connectors 102. A difference comparing to the package structure 800 is that no through vias exist in the second die 101b. The interconnect wirings 321 may electrically connect to the second semiconductor die 101b by connecting to the interconnect wirings 122a in the first die 101a firstly.

Figure 10:
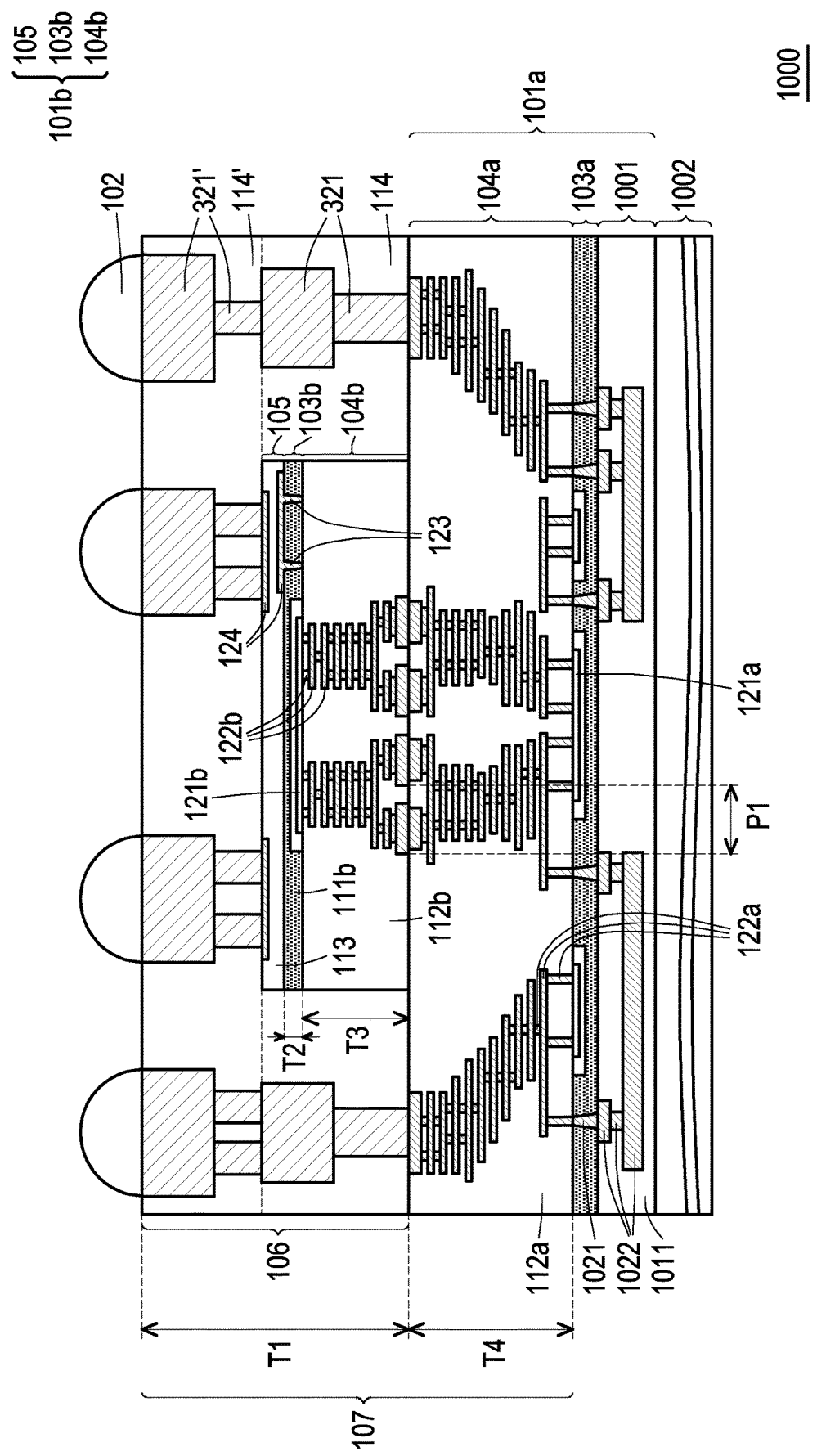
FIG. 10 is a cross-sectional view of a package structure in accordance with an embodiment of the present invention.

In FIG. 10, a package structure 1000 is shown. Alike package structure 300 in FIG. 3D, a second semiconductor die 101b is embedded in the interconnect structure 106 above the interconnect structure 104a on the first semiconductor die 101a. The first semiconductor die 101a further comprises through vias 1021, interconnect structure 1001 with dielectric layers 1011 and interconnect wirings 1022 embedded in the dielectric layers 1011 at the backside of the semiconductor substrate 103a. In some embodiments, the through vias 1021 and the interconnect wirings 1022 on the backside of the first die 101a can be designed with a power distribution network circuitry function to facilitate the power delivery from outer systems. Moreover, a carrier structure 1002 is attached to the interconnect structure 1001 and thus the interconnect structure 1001 lays between the semiconductor substrate 103a and the carrier structure 1002. The material and method of formation for interconnect structure 1001 may be similar to that of the interconnect structures 104a, 104b, 105 and 106. Furthermore, the material and method of formation for through vias 1021 may be similar to that of the through vias 123. Other suitable materials or processes may be also utilized if feasible. As for the carrier 1002 structure, the material may be a glass carrier, a silicon substrate or any suitable carrier for carrying a semiconductor wafer or a reconstituted wafer for the manufacturing method of the semiconductor package. The attachment between interconnect structure 1001 and carrier 1002 may be formed by fusion bonding, glue layer, attach film (with attaching layers not shown on 1002) or any other suitable methods.

Figure 11:
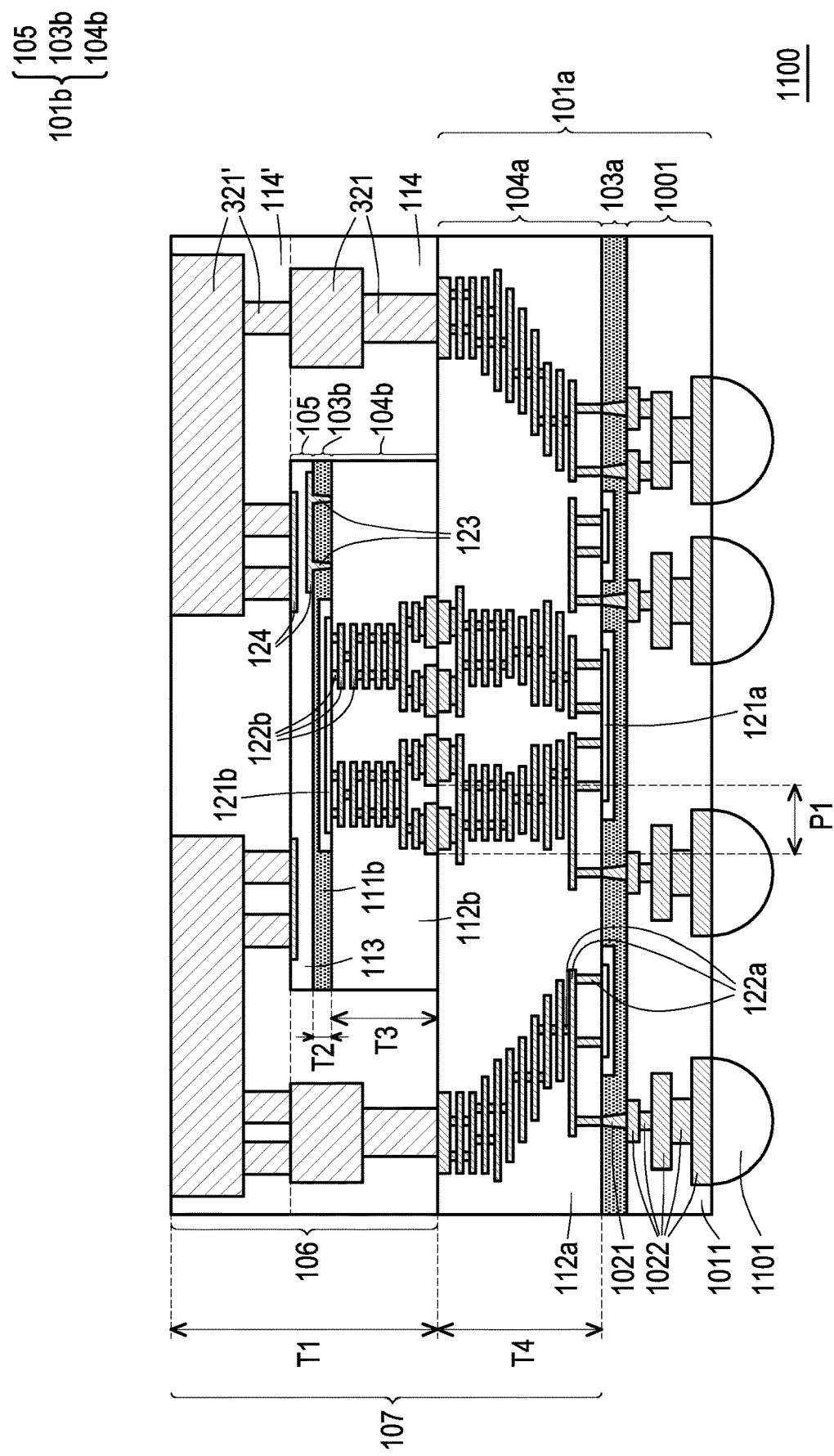
FIG. 11 is a cross-sectional view of a package structure in accordance with an embodiment of the present invention.

Referring to FIG. 11, the package structure 1100 is shown. Alike package structure 1000, the first semiconductor die 101a comprises an interconnect structure 104a at the front side of the semiconductor substrate 103a and another interconnect structure 1001 at the back side of the semiconductor substrate 103a. The difference of package structure 1100 to the structure 1000 is that a set of connection terminals 1101 are formed in electrical contact with the outmost layer of interconnect structures 1022. The connection terminals 1101 can be metal pillars, μ-bumps, solder bumps, controlled collapse chip connection (C4) bumps, ball-grid array (BGA) balls or the like, that may comprise metal material such as aluminum, copper, nickel, gold, silver, solder, tin, lead, or a combination thereof. In some embodiments, the interconnect structure 1001 together with the through vias 1021 can be designed as a power distribution network (PDN) circuitry with power rails that can be configured to transmit power and ground signals to the devices in semiconductor die 101a and/or the semiconductor die 101b. In some embodiments, the power and ground signals fed to the device regions 121a and/or device regions 121b are provided from a back side of the substrate 103a. As compared to providing power and ground signals to the device regions 121a from above the stack of interconnect layers 122a, the power and ground signals can be provided to the device regions 121a along a shorter path from the back side of the substrate 103a, according to embodiments of the present disclosure. Moreover, since the power distribution network are disposed at the backside of semiconductor substrate 103a and the device regions 121a, routing areas above the device regions 121a can be significantly released.

According to some embodiments, a package structure includes a first semiconductor die, including a semiconductor substrate and a first interconnect structure disposed on the semiconductor substrate; a second semiconductor die disposed on and electrically connected to the first semiconductor die, including a second semiconductor substrate and a second interconnect structure; a third interconnect structure, where in the second interconnect structure and the third interconnect structure are disposed on opposite sides of the second semiconductor substrate, and wherein the second interconnect structure is between the first interconnect structure and the third interconnect structure.

According to some embodiments, a package structure includes a first semiconductor die, including a semiconductor substrate and a first interconnect structure disposed on the semiconductor substrate; a second semiconductor die embedded and electrically connected to the first interconnect structure.

According to some embodiments, a method of forming a package structure includes forming a first portion of an interconnect structure on a first semiconductor substrate; placing a second semiconductor die on the first portion of the interconnect structure; forming a second portion of the interconnect structure on the first portion of the interconnect structure and the second semiconductor die, wherein the interconnect structure is electrically connected to the second semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a first semiconductor die comprising a first semiconductor substrate and a first interconnect structure disposed on the semiconductor substrate;

a second semiconductor die disposed on and electrically connected to the first semiconductor die, the second semiconductor die comprising:
  a second semiconductor substrate;
  a second interconnect structure;
  a third interconnect structure, wherein the second interconnect structure and the third interconnect structure are disposed on opposite sides of the second semiconductor substrate, and wherein the second interconnect structure is between the first interconnect structure and the third interconnect structure; and
  first through vias penetrating through the second semiconductor substrate and the second interconnect structure, and the first through vias are electrically connected to the first interconnect structure.

2. The semiconductor package according to claim 1, wherein the second semiconductor die comprises a power distribution network circuitry.

3. The semiconductor package according to claim 1, wherein the second interconnect structure is thicker than the second semiconductor substrate.

4. The semiconductor package according to claim 1, wherein the second semiconductor die further comprises second first-through vias penetrating through the second semiconductor substrate, the second through vias comprise first ends and second ends opposite to the first ends, the first ends are in contact with the second interconnect structure, the second ends are in contact with the third interconnect structure, and the second ends are wider than the first ends.

5. The semiconductor package according to claim 1, wherein the first through vias protrude into the third interconnect structure.

6. A semiconductor package, comprising:
  a first semiconductor die comprising a first semiconductor substrate and a first interconnect structure disposed on the first semiconductor substrate;
  a second semiconductor die embedded in and electrically connected to the first interconnect structure, wherein the second semiconductor die comprises a second semiconductor substrate, a second interconnect structure and a third interconnect structure, the second interconnect structure and the third interconnect structure are disposed on opposite sides of the second semiconductor substrate, and the second interconnect structure is between the first interconnect structure and the third interconnect structure.

7. The semiconductor package according to claim 6, wherein
  the first interconnect structure comprises first dielectric layers stacked on the first semiconductor substrate, first interconnect wirings embedded in the first dielectric layers, second dielectric layers stacked on the first dielectric layers, and second interconnect wirings embedded in the second dielectric layer,
  the second semiconductor die is disposed on the first dielectric layers and embedded in the second dielectric layers,
  the second interconnect structure is electrically connected to the first interconnect wirings, and the third interconnect structure is electrically connected to the second interconnect wirings.

8. The semiconductor package according to claim 7, wherein the second semiconductor die further comprises through vias penetrating through the semiconductor substrate and the second interconnect structure.

9. The semiconductor package according to claim 7 further comprising:
  a dielectric material laterally encapsulating the second semiconductor die.

10. The semiconductor package according to claim 6, wherein
  the first interconnect structure comprises first dielectric layers stacked on the first semiconductor substrate, first interconnect wirings embedded in the first dielectric layers, second dielectric layers stacked on the first dielectric layers, and second interconnect wirings embedded in the second dielectric layer,
  the second semiconductor die is embedded in the first dielectric layers and the second dielectric layers,
  the second interconnect structure is electrically connected to the first interconnect wirings, and the third interconnect structure is electrically connected to the second interconnect wirings.

11. The semiconductor package according to claim 10 further comprising:
  a dielectric material laterally encapsulating the second semiconductor die.

12. The semiconductor package according to claim 6, wherein
  the second semiconductor die comprises a second semiconductor substrate, a second interconnect structure disposed on the second semiconductor substrate, and through vias penetrating through the semiconductor substrate and the second interconnect structure, and the second interconnect structure is between the first interconnect structure and the second semiconductor substrate,
  the first interconnect structure comprises first dielectric layers stacked on the first semiconductor substrate, first interconnect wirings embedded in the first dielectric layers, second dielectric layers stacked on the first dielectric layers, and second interconnect wirings embedded in the second dielectric layer,
  the second semiconductor die is disposed on the first dielectric layers and embedded in the second dielectric layers,
  the second interconnect structure is electrically connected to the first interconnect wirings and the second interconnect wirings.

13. The semiconductor package according to claim 6, wherein the first semiconductor die is wider than the second semiconductor die.

14. The semiconductor package according to claim 6, wherein the first semiconductor die further comprises through substrate conductive structures and backside wirings, and the backside wirings are electrically connected to the first interconnect structure through the through substrate conductive structures.

15. The semiconductor package according to claim 14 further comprising a carrier attached to the first semiconductor die.

16. The semiconductor package according to claim 14 further comprising conductive terminals electrically connected to the backside wirings.

17. A method, comprising:
  forming a first portion of an interconnect structure on a first semiconductor substrate;
  placing a second semiconductor die on the first portion of the interconnect structure;
  forming a second portion of the interconnect structure on the first portion of the interconnect structure and the second semiconductor die, wherein the interconnect structure is electrically connected to the second semiconductor die; and attaching a carrier to the first semiconductor die after forming the second portion of the interconnect structure.

18. The method according to claim 17 further comprising:
forming a cavity in the first portion of the interconnect structure, wherein the second semiconductor die is placed in the cavity.

19. The method according to claim 18 further comprising:
forming a dielectric material in the cavity before forming the second portion of the interconnect structure, wherein the dielectric material laterally encapsulates the second semiconductor die.

20. The method according to claim 17, wherein the second portion of the interconnect structure is formed after placing the second semiconductor die on the first portion of the interconnect structure, and the second portion of the interconnect structure is formed to laterally surround at least an upper portion of the second semiconductor die.

* * * * *